(12) United States Patent
Chen et al.

(10) Patent No.: US 12,484,288 B2
(45) Date of Patent: Nov. 25, 2025

(54) SEMICONDUCTOR DEVICE WITH FIRST AND SECOND SOURCE/DRAIN EPITAXIAL LAYERS

(71) Applicant: Taiwan Semiconductor Manufacturing Company, Ltd., Hsinchu (TW)

(72) Inventors: Te-An Chen, Beitun District (TW); Meng-Han Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/443,106

(22) Filed: Feb. 15, 2024

(65) Prior Publication Data

US 2024/0186185 A1 Jun. 6, 2024

Related U.S. Application Data

(60) Continuation of application No. 17/855,297, filed on Jun. 30, 2022, now Pat. No. 11,935,791, which is a
(Continued)

(51) Int. Cl.
*H10D 84/85* (2025.01)
*B82Y 10/00* (2011.01)
(Continued)

(52) U.S. Cl.
CPC ......... *H10D 84/013* (2025.01); *H10D 30/797* (2025.01); *H10D 62/021* (2025.01);
(Continued)

(58) Field of Classification Search
CPC .. H10D 84/013; H10D 30/797; H10D 62/021; H10D 84/017; H10D 62/151;
(Continued)

(56) References Cited

U.S. PATENT DOCUMENTS

| 8,551,843 B1 | 10/2013 | Cai et al. |
| 8,962,400 B2 | 2/2015 | Tsai et al. |

(Continued)

FOREIGN PATENT DOCUMENTS

| TW | 201304055 A | 1/2013 |
| TW | 201332021 A | 8/2013 |

OTHER PUBLICATIONS

Non-Final Office Action issued in U.S. Appl. No. 16/938,875, dated Jan. 14, 2022.
(Continued)

*Primary Examiner* — Sonya McCall-Shepard
(74) *Attorney, Agent, or Firm* — STUDEBAKER BRACKETT PLLC

(57) ABSTRACT

In a method of manufacturing a semiconductor device, an isolation structure is formed in a substrate defining an active region, a first gate structure is formed over the isolation structure and a second gate structure over the active region adjacent to the first gate structure, a cover layer is formed to cover the first gate structure and a part of the active region between the first gate structure and the second gate structure, the active region between the first gate structure and the second gate structure not covered by the cover layer is etched to form a recess, and an epitaxial semiconductor layer is formed in the recess.

20 Claims, 37 Drawing Sheets

Related U.S. Application Data division of application No. 16/938,875, filed on Jul. 24, 2020, now Pat. No. 11,515,212.

(60) Provisional application No. 62/928,055, filed on Oct. 30, 2019.

(51) Int. Cl.

| | | |
|---|---|---|
| *H01L 21/28* | (2025.01) | |
| *H10D 30/01* | (2025.01) | |
| *H10D 30/43* | (2025.01) | |
| *H10D 30/67* | (2025.01) | |
| *H10D 30/69* | (2025.01) | |
| *H10D 62/00* | (2025.01) | |
| *H10D 62/10* | (2025.01) | |
| *H10D 62/13* | (2025.01) | |
| *H10D 64/01* | (2025.01) | |
| *H10D 84/01* | (2025.01) | |
| *H10D 84/03* | (2025.01) | |
| *H10D 84/83* | (2025.01) | |

(52) U.S. Cl.
CPC ....... *H10D 62/151* (2025.01); *H10D 84/0135* (2025.01); *H10D 84/0151* (2025.01); *H10D 84/038* (2025.01); *H10D 84/853* (2025.01); *H10D 30/6735* (2025.01); *H10D 84/017* (2025.01); *H10D 84/85* (2025.01)

(58) Field of Classification Search
CPC ........... H10D 84/0135; H10D 84/0151; H10D 84/038; H10D 84/853; H10D 30/6735; H10D 84/85; H10D 30/6757; H10D 30/43; H10D 64/017; H10D 30/014; H10D 62/121; H10D 84/0158; H10D 84/0128; H10D 84/0133; H10D 84/83; H10D 62/115–116; H10D 84/0188; B82Y 10/00; H01L 21/28123; H01L 21/76224–76237

See application file for complete search history.

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,324,866 B2 | 4/2016 | Yu et al. |
| 9,379,106 B2 | 6/2016 | Hong et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,735,242 B2 | 8/2017 | Xie et al. |
| 9,812,363 B1 | 11/2017 | Liao et al. |
| 9,859,380 B2 | 1/2018 | Lee et al. |
| 2005/0173759 A1 | 8/2005 | Kim et al. |
| 2017/0103981 A1 | 4/2017 | Hung et al. |
| 2017/0200824 A1 | 7/2017 | Yu et al. |
| 2017/0317078 A1 | 11/2017 | Chang et al. |
| 2017/0365604 A1 | 12/2017 | Suh et al. |
| 2018/0323107 A1* | 11/2018 | Zhou .................... H10D 84/834 |
| 2020/0035705 A1 | 1/2020 | Kim et al. |

OTHER PUBLICATIONS

Notice of Allowance issued in U.S. Appl. No. 17/855,297, dated Nov. 15, 2023.

Final Rejection issued in U.S. Appl. No. 17/855,297, dated Aug. 25, 2023.

Non-Final Rejection issued in U.S. Appl. No. 17/855,297, dated May 9, 2023.

\* cited by examiner

SEMICONDUCTOR DEVICE WITH FIRST AND SECOND SOURCE/DRAIN EPITAXIAL LAYERS

RELATED APPLICATIONS

This application is a continuation application of U.S. patent application Ser. No. 17/855,297, filed Jun. 30, 2022, which is a divisional application of U.S. patent application Ser. No. 16/938,875 filed Jul. 24, 2020, now U.S. Pat. No. 11,515,212, which claims priority to U.S. Provisional Patent Application No. 62/928,055 filed Oct. 30, 2019, the entire contents of each of which are incorporated herein by reference.

BACKGROUND

Complementary metal-oxide-semiconductor field effect transistors (CMOS FETs) have been utilized for their low power consumption. In CMOS FETs, however, preventing latch-up has been one of the issues in device and process technologies. With increasing down-scaling of integrated circuits and increasingly demanding speed requirements of integrated circuits, more effective measures to prevent drain induced barrier lowering (DIBL) and latch up are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
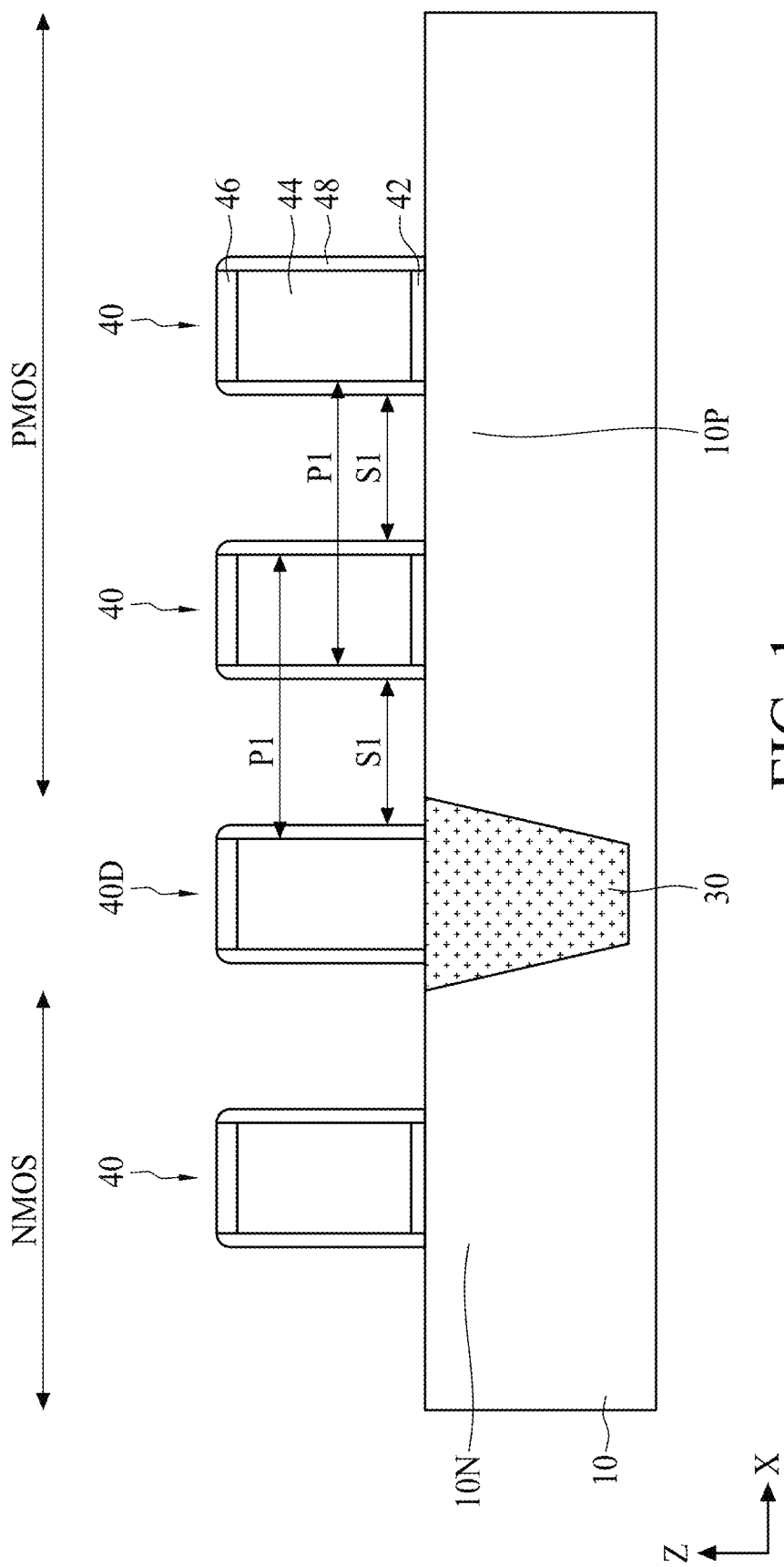
FIG. 1 illustrates a cross sectional view of one of the various stages of a semiconductor device fabrication process in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations inbetween the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

Disclosed embodiments relate to a semiconductor device, in particular, a CMOS FET, for example, a planar field effect transistor, a fin field effect transistor (FinFET) and a gate-all-around FET, and their manufacturing methods.

Strained silicon technology has been widely used in modern Si industry. Compressive or tensile strain applied from an epitaxially formed layer modifies the lattice constant of a semiconductor layer, which can increase carrier mobility. In source/drain epitaxy, for example, the hole mobility of a p-type FET can be significantly boosted when a SiGe epitaxial layer is formed at a silicon source/drain, because germanium or silicon germanium has larger lattice constant than silicon. A SiGe epitaxial layer provides compressive stress to a silicon channel of a p-type FET. Similarly, a SiP or SiCP epitaxial layer provide tensile stress to a silicon channel of an n-type FET.

An epitaxial layer is often epitaxially formed in and over a recess formed in an underlying crystalline semiconductor layer. However, when the recess is partially formed by a non-crystalline material, such as an insulating layer, the epitaxial layer does not fully grow and an epitaxial volume is smaller compared with the case where the recess is fully formed by a crystalline semiconductor. When the source/drain epitaxial layer does not sufficiently grow at an edge of an insulating layer, the compressive stress is insufficient, which causes a lower driving current, and asymmetric device character may occur.

In the present disclosure, a method and structure for improving a source/drain epitaxial layer grown near an isolation structure, such as shallow trench isolation (STI) are provided.

FIGS. 1-11 show cross sectional views of a sequential manufacturing operation for a semiconductor device in accordance with an embodiment of the present disclosure. It is understood that additional operations can be provided before, during, and after processes shown by FIGS. 1-11, and some of the operations described below can be replaced or eliminated, for additional embodiments of the method. The order of the operations/processes may be interchangeable.

As shown in FIG. 1, an isolation structure, such as an STI 30, is formed in the surface of a substrate 10. The substrate 10 may be a p-type or an n-type semiconductor substrate. In some embodiments, the substrate 10 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide (GaAs), indium gallium arsenide (InGaAs), indium arsenide (InAs), indium phosphide (InP), indium antimonide (InSb), gallium arsenic phosphide (GaAsP), or gallium indium phosphide (GaInP)), or the like. Further, the substrate 100 may include an epitaxial layer (epi-layer), which may be strained for performance enhancement, and/or may include a silicon-on-insulator (SOI) structure. In one embodiment, a p-type silicon substrate is used.

The isolation structure 30 is formed by filling a trench formed in the substrate 10 with one or more insulating materials, and then performing a planarization operation, such as a chemical mechanical polishing (CMP) process. The isolation structure 30 includes one or more layers of insulating materials, for example, silicon dioxide, silicon oxynitride and/or silicon nitride formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation structure 30 may be formed by one or more layers of SOG, SiO, SiON, SiOCN or fluorine-doped silicate glass (FSG) in some embodiments. The isolation structure 30 defines an active region, which is utilized as a channel region and source/drain regions of an FET. In some embodiments, the isolation structure 30 surrounds an active region in plan view. In some embodiments, as shown in FIG. 1, a first active region 10P for a p-type FET (PMOS) and a second active region 10N for an n-type FET (NMOS) are provided.

Further, as shown in FIG. 1, sacrificial gate structures 40 and a dummy sacrificial gate structure 40D are formed. The sacrificial gate structures 40 are disposed over the active regions 10P and 10N, and the dummy sacrificial gate structure 40D is disposed over the isolation structure 30.

Each of the sacrificial gate structures 40 includes a sacrificial gate dielectric layer 42, a sacrificial gate electrode 44 and a hard mask layer 46 in some embodiments. The dummy sacrificial gate structure 40D includes a sacrificial gate electrode 44 and a hard mask layer 46 in some embodiments. In some embodiments, the sacrificial gate electrode is made of polysilicon, and the sacrificial gate dielectric layer is made of silicon oxide.

Further, each of the sacrificial gate structures 40 and the dummy sacrificial gate structure 40D include gate sidewall spacers 48 on opposing side faces of the sacrificial gate electrodes. The gate sidewall spacers 48 include one or more dielectric layers. In some embodiments, the sidewall spacers are made of one or more of silicon oxide, silicon nitride, SiOCN, SiCN, aluminum oxide, AlCO or AlCN, or any other suitable dielectric material.

Figure 2:
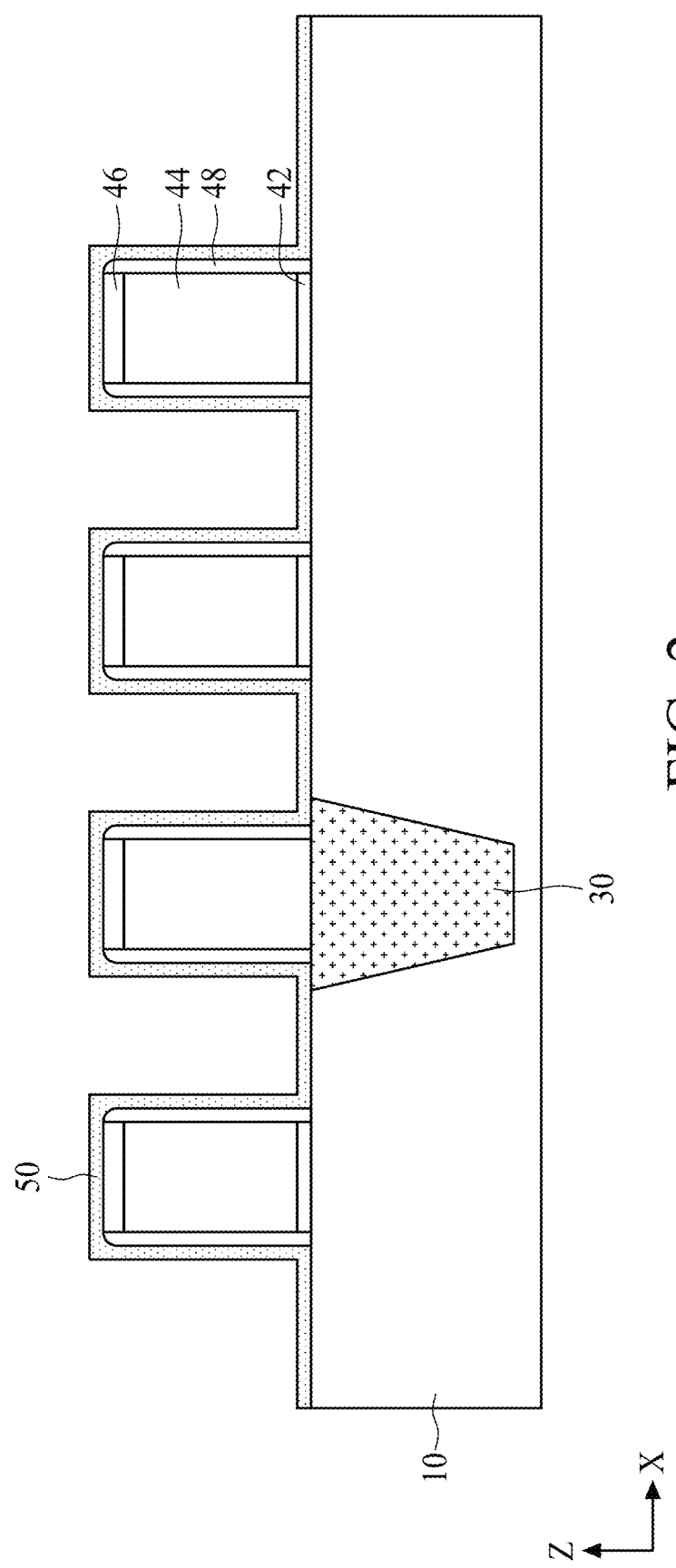
FIG. 2 illustrates a cross sectional view of one of the various stages of a semiconductor device fabrication process in accordance with an embodiment of the present disclosure.

In some embodiments, the sacrificial gate structures 40 and the dummy sacrificial gate structure 40D extend in the Y direction and are arranged in the X direction with a constant pitch P1. Next, as shown in FIG. 2, a cover layer 50 is formed over the sacrificial gate structures 40, the dummy sacrificial gate structure 40D, the active regions and the isolation structure 30. In some embodiments, the cover layer 50 is made of a material different from the gate sidewall spacers 48. In some embodiments, the cover layer 50 is made of a material different from the hard mask layer 46. In some embodiments, the cover layer is made of one or more of silicon oxide, silicon nitride, SiOCN, SiCN, aluminum oxide, AlCO or AlCN, or any other suitable dielectric material. The cover layer 50 may be formed through one or more processes such as chemical vapor deposition (CVD), physical vapor deposition (PVD) and atomic layer deposition (ALD), although any acceptable process may be utilized. In some embodiments, the cover layer 50 has a thickness in a range from about 4 nm to about 10 nm, depending on the design rule of the semiconductor device. In other embodiments, the thickness of the cover layer 50 is in a range from about 5 nm to about 8 nm.

Figure 3:
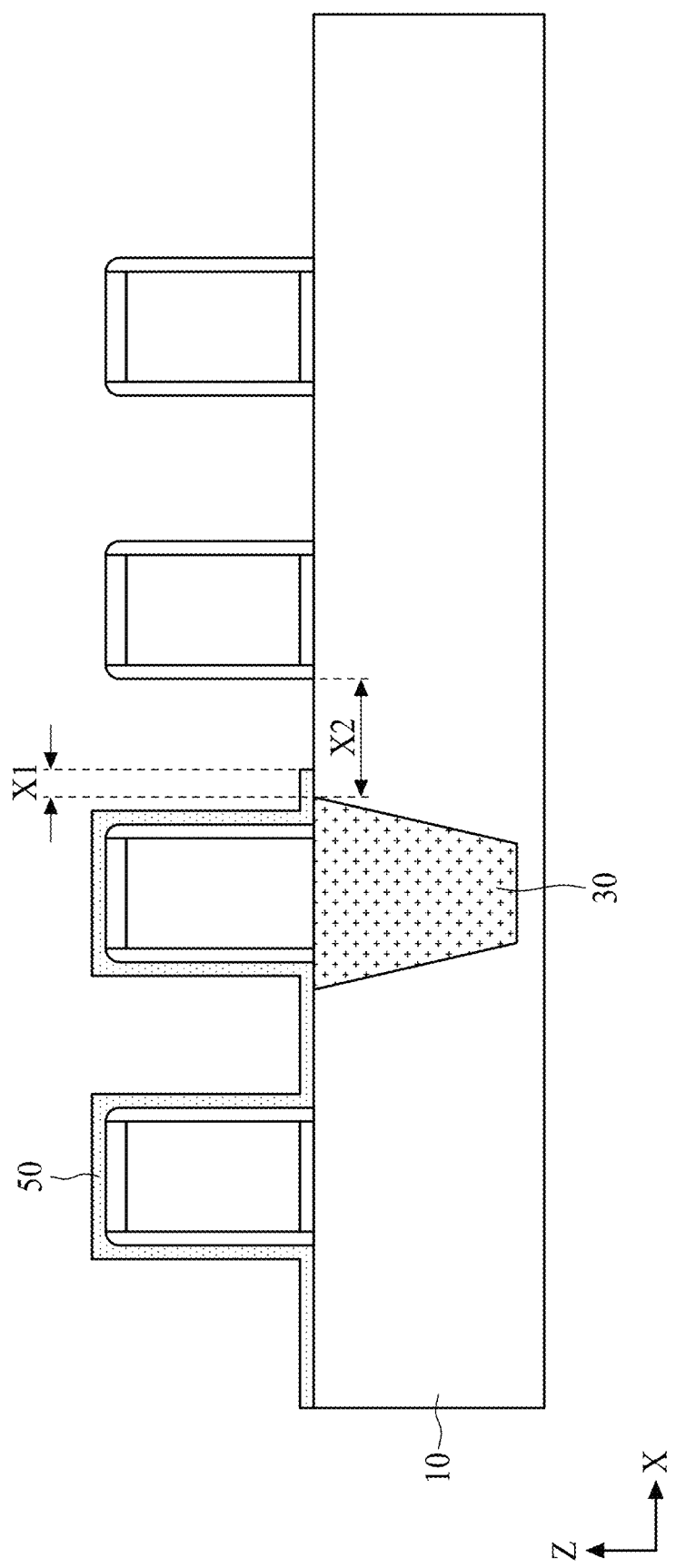
FIG. 3 illustrates a cross sectional view of one of the various stages of a semiconductor device fabrication process in accordance with an embodiment of the present disclosure.

The cover layer 50 is blanket-formed over the entire structures, and patterned by one or more lithography and etching operations, as shown in FIG. 2. By the patterning operation, the first active region 10P for the p-type FET is exposed, except for an edge portion near the isolation structure. As shown in FIG. 3, the cover layer 50 covers an edge portion of the first active region 10P and a part of the isolation structure 30. A distance X1 from the edge of the isolation structure 30 to the edge of the cover layer 50 over the first active region 10P is in a range from 10 nm to 30 nm in some embodiments, and is in a range from about 15 nm to about 25 nm in other embodiments, depending on the design rule of the semiconductor device. As shown in FIG. 3, a region of the first active region 10P between the isolation structure 30 and the adjacent sacrificial gate structure 40 has a width X2 in the X direction, which is smaller than a space SI between two adjacent sacrificial gate structures 40. In some embodiments, a ratio X1/X2 is in a range from about 0.2 to about 0.3 depending on the design rule of the semiconductor device. If X1/X2 is too small, the effect of the present embodiments as explained below would not be obtained, and if X1/X2 is too large, a size of the epitaxial layer subsequently formed would be insufficient.

Figure 4:
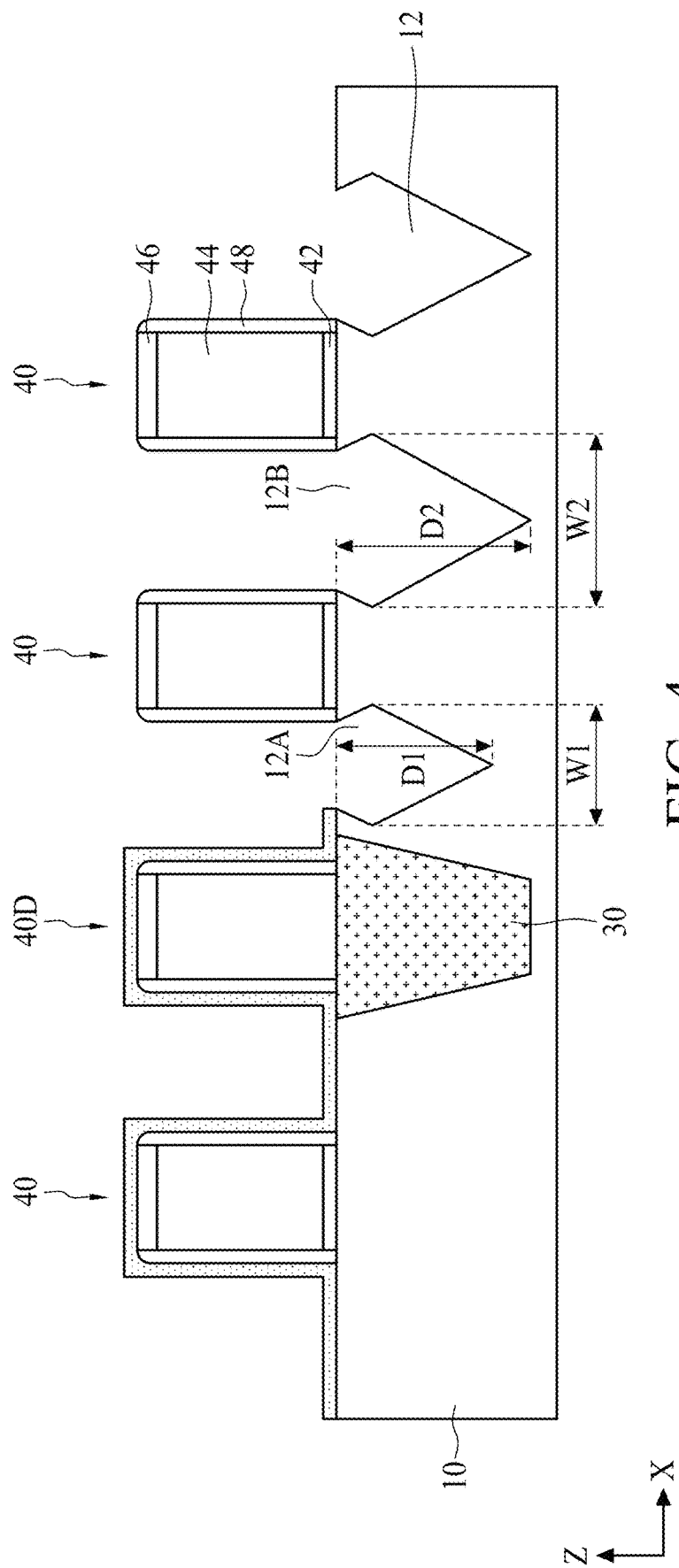
FIG. 4 illustrates a cross sectional view of one of the various stages of a semiconductor device fabrication process in accordance with an embodiment of the present disclosure.

Then, as shown in FIG. 4, source/drain regions of the first active region 10P not covered by the sacrificial gate structures 40 and the cover layer 50 are etched (recessed) by using a suitable etching operation to form recesses 12. Since a part of the active region 10P is covered by the cover layer 50, the opening size of the recess 12A is smaller than the opening size of the recess 12B. Accordingly, as shown in FIG. 4, the recess 12A adjacent to the isolation structure 30 is smaller in size than the recess 12B formed between sacrificial gate structures 40. In some embodiments, the depth D1 of the recess 12A is about 80% to about 95% of the depth D2 of the recess 12B, and is about 85% to about 90% of the depth D2 in other embodiments. In some embodiments, the maximum width W1 of the recess 12A is about 40% to about 65% of the maximum width W2 of the recess 12B, and is about 50% to about 60% of the maximum width W2 in other embodiments.

Figure 5:
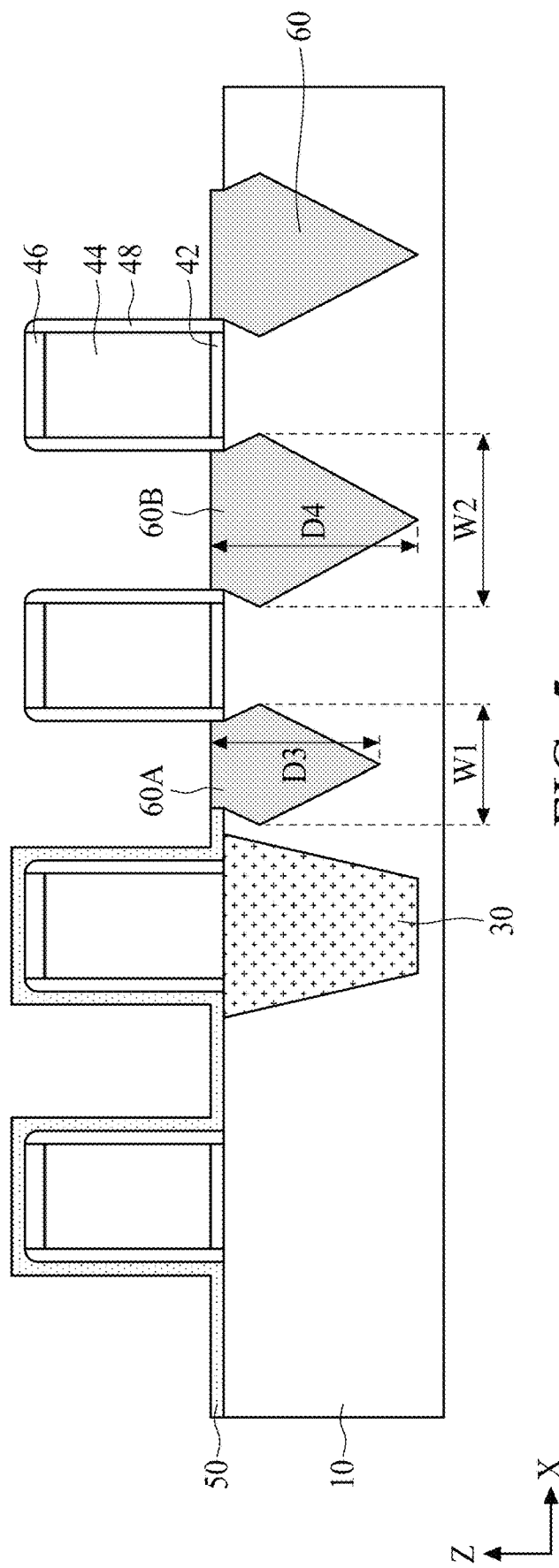
FIG. 5 illustrates a cross sectional view of one of the various stages of a semiconductor device fabrication process in accordance with an embodiment of the present disclosure.

After the recesses are formed, a source/drain epitaxial layer 60 is formed in the recesses, as shown in FIG. 5. In some embodiments, the source/drain epitaxial layer 60 includes a SiGe layer. In some embodiments, the SiGe layer is doped with B. In some embodiments, the source/drain epitaxial layer 60 includes multiple SiGe layers with different Ge contents. In certain embodiments, the source/drain epitaxial layer 60 includes a Ge layer.

As shown in FIG. 5, the source/drain epitaxial layer 60A formed between the isolation structure 30 and the adjacent sacrificial gate structure 40 is smaller in volume than the source/drain epitaxial layer 60B formed between the adjacent sacrificial gate structures 40. In some embodiments, the depth D3 of the source/drain epitaxial layer 60A is about 80% to about 95% of the depth D4 of the source/drain epitaxial layer 60B, and is about 85% to about 90% of the depth D4 in other embodiments. In some embodiments, the maximum width W1 of the source/drain epitaxial layer 60A is about 40% to about 65% of the maximum width W2 of the source/drain epitaxial layer 60B, and is about 50% to about 60% of the maximum width W2 in other embodiments.

Figure 6:
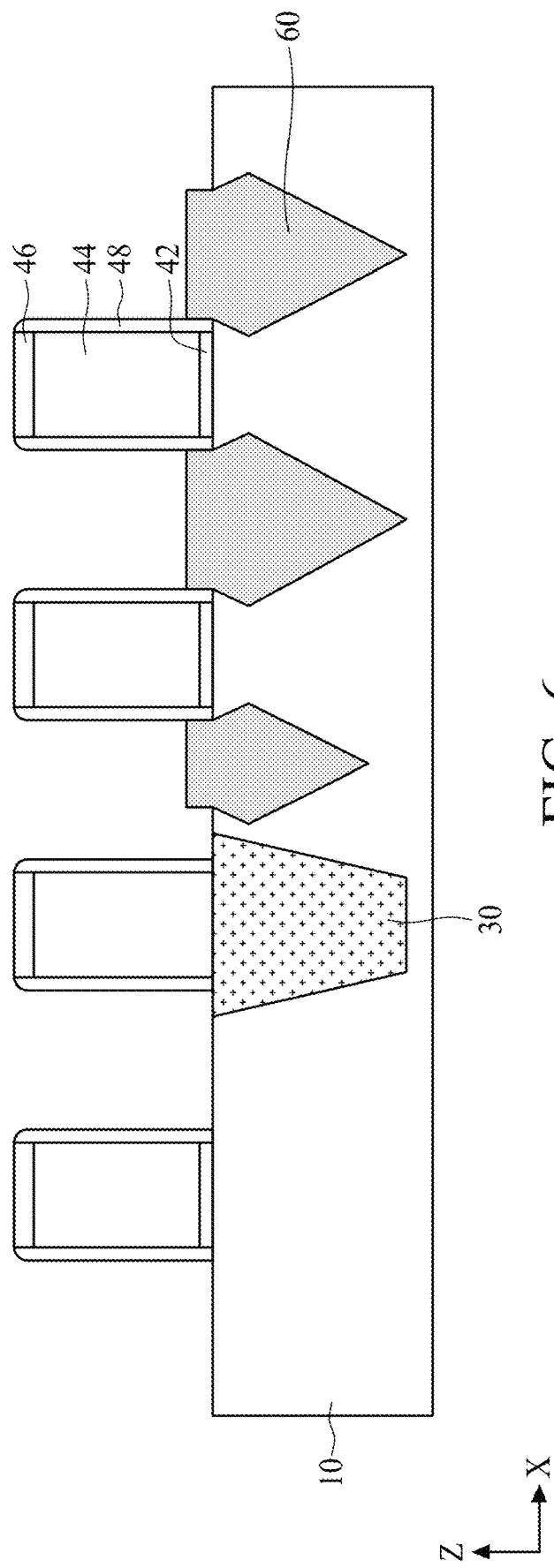
FIG. 6 illustrates a cross sectional view of one of the various stages of a semiconductor device fabrication process in accordance with an embodiment of the present disclosure.

After the source/drain epitaxial layer 60 is formed, the cover layer 50 is removed, as shown in FIG. 6.

After the source/drain epitaxial layer 60 for a p-type FET is formed, a source/drain epitaxial layer for an n-type FET is formed. Materials, configurations, dimensions, structures, conditions and operations the same as or similar to those explained with the formation of the source/drain epitaxial layer 60 for a p-type FET as set forth above may be employed in the formation of a source/drain epitaxial layer for an n-type FET, and some of the explanations may be omitted.

Figure 7:
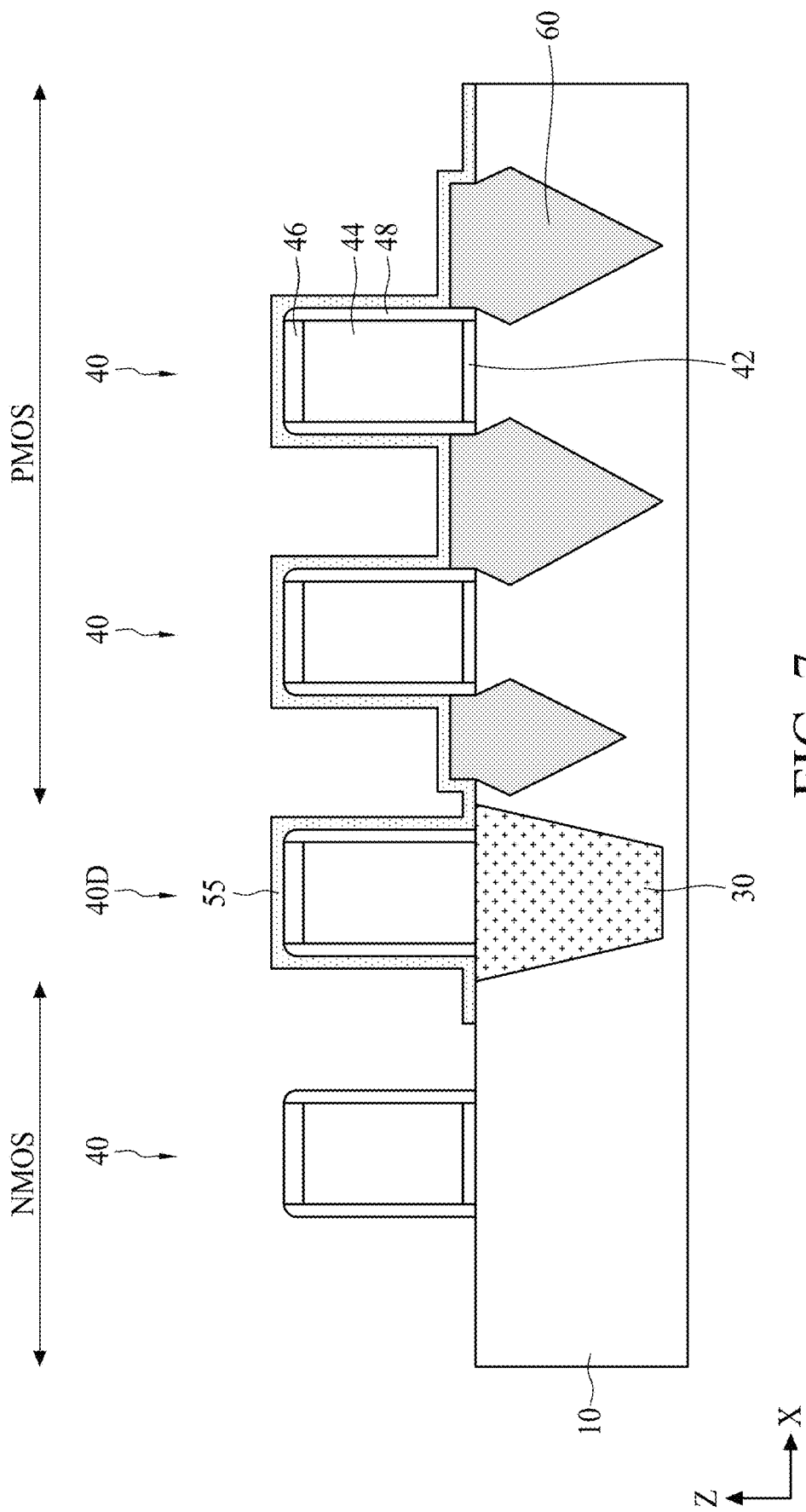
FIG. 7 illustrates a cross sectional view of one of the various stages of a semiconductor device fabrication process in accordance with an embodiment of the present disclosure.

As shown in FIG. 7, a cover layer 55 is formed over the sacrificial gate structures 40, the dummy sacrificial gate structure 40D, the first active region for the p-type FET and the isolation structure 30. In some embodiments, the configuration of the cover layer 55 is the same as or similar material to the configuration of the cover layer 50 as set forth above. As shown in FIG. 7, the cover layer 55 includes an opening in which the second active region 10N for the n-type FET is exposed, except for an edge portion near the isolation structure. As shown in FIG. 7, the cover layer 55 covers an edge portion of the second active region 10N and a part of the isolation structure 30.

Figure 8:
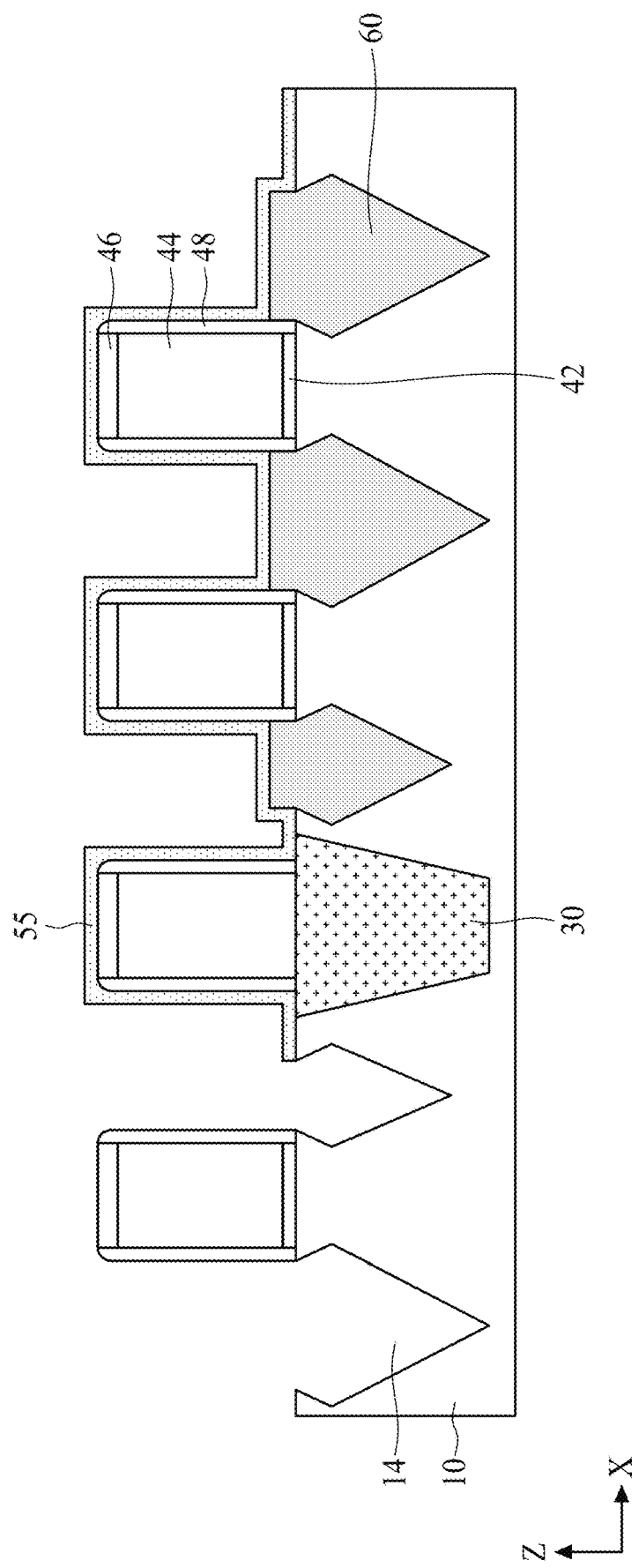
FIG. 8 illustrates a cross sectional view of one of the various stages of a semiconductor device fabrication process in accordance with an embodiment of the present disclosure.

Then, similar to FIG. 4, the source/drain regions of the second active region 10N not covered by the sacrificial gate structure 40 and the cover layer 55 are etched (recessed) by using a suitable etching operation to form recesses 14, as shown in FIG. 8.

Figure 9:
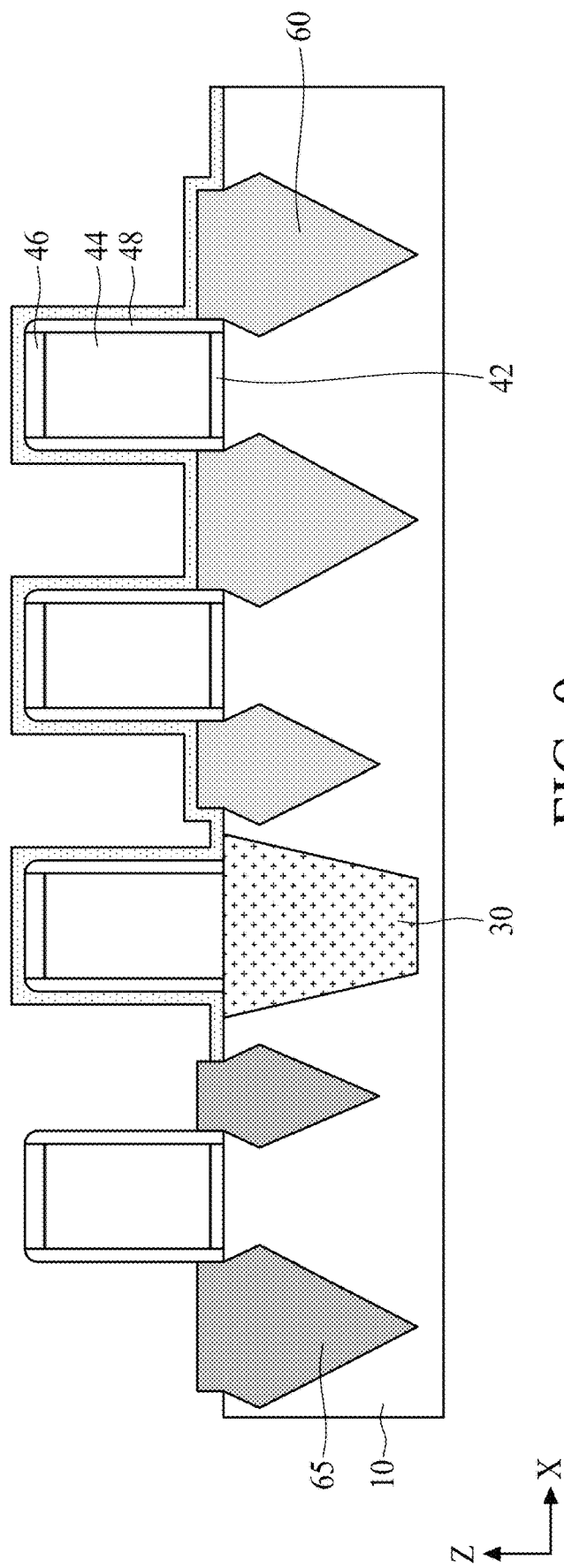
FIG. 9 illustrates a cross sectional view of one of the various stages of a semiconductor device fabrication process in accordance with an embodiment of the present disclosure.

Further, after the recesses 14 are formed, a source/drain epitaxial layer 65 is formed in the recesses, as shown in FIG. 9. In some embodiments, the source/drain epitaxial layer 65 includes one or more of SiP, SiCP and SiC layers. In some embodiments, the SiP or SiCP layer further includes As. In some embodiments, multiple epitaxial layers with different P contents are formed. After the epitaxial layer 65 is formed, the cover layer 55 is removed.

In some embodiments, after the source/drain epitaxial layer 65 for an n-type FET is formed, a source/drain epitaxial layer 60 for a p-type FET is formed.

Figure 10:
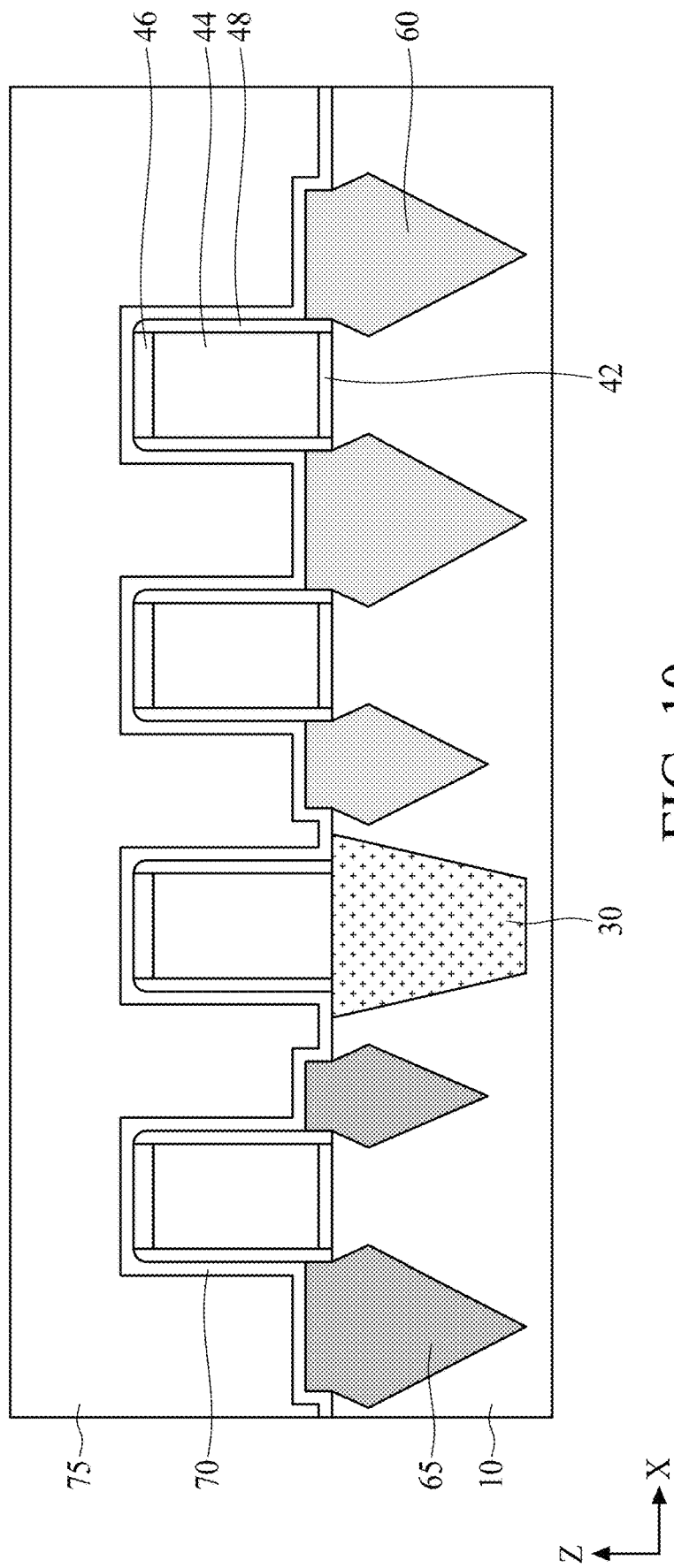
FIG. 10 illustrates a cross sectional view of one of the various stages of a semiconductor device fabrication process in accordance with an embodiment of the present disclosure.
Figure 11:
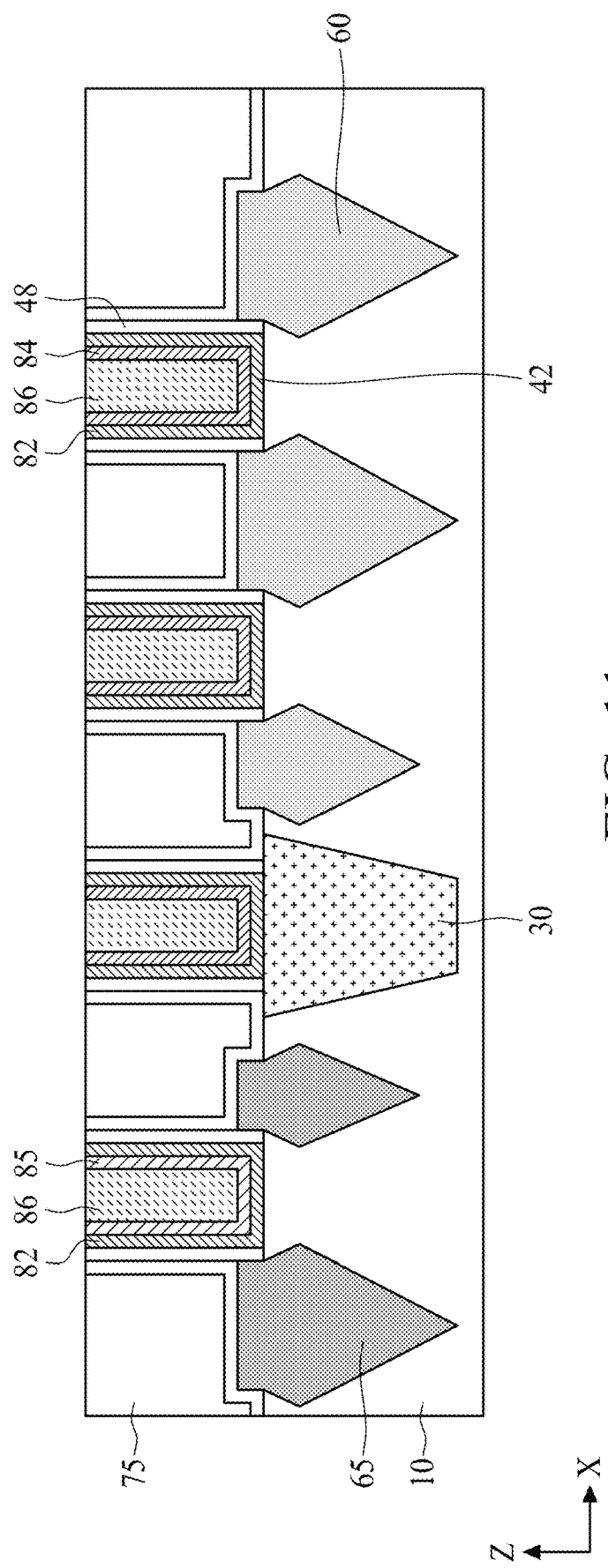
FIG. 11 illustrates a cross sectional view of one of the various stages of a semiconductor device fabrication process in accordance with an embodiment of the present disclosure.

Subsequently, a replacement gate operation is performed to form a metal gate structure. As shown in FIG. 10, an etch stop layer 70 is formed over the sacrificial gate structures 40, 40D and the source/drain epitaxial layers 60, 65, and then one or more interlayer dielectric (ILD) layer 75 is formed over the etch stop layer 70. In some embodiments, the etch stop layer 70 includes silicon nitride.

After the ILD layer 75 is formed, a planarization operation, such as an etch-back process and/or a chemical mechanical polishing (CMP) process, is performed to expose the upper surface of the sacrificial gate electrode layer 44. Then, the sacrificial gate electrode layer 44 and the sacrificial gate dielectric layer 42 are removed, thereby forming a gate space. Then, a gate dielectric layer 82 including an interfacial layer and a high-k gate dielectric layer is formed on the channel region in the gate space. The interfacial layer is a chemically formed silicon oxide in some embodiments. The high-k gate dielectric layer includes one or more layers of $HfO_2$, HfSIO, HfSION, HfTaO, HfTIO, HfZrO, zirconium oxide, aluminum oxide, titanium oxide, hafnium dioxide-alumina ($HfO_2$—$Al_2O_3$) alloy, or any other suitable high-k dielectric materials.

In addition, one or more conductive layers are formed over the gate dielectric layer 82. The conductive layer may include a barrier layer formed by one or more layers of TaN, TiN, TiN doped with Si, or any other suitable conductive material. The conductive layers further include one or more work function adjustment layers. The work function adjustment layer is made of a conductive material such as a single layer of TiN, TaN, TaAlC, TIC, TaC, Co, Al, TiAl, HfTi, TiSi, TaSi or TiAlC, or a multilayer of two or more of these materials. As the work function adjustment layer 85 for the n-channel FinFET, one or more of TaN, TaAlC, TIN, TiC, Co, TiAl, HfTi, TiSi and TaSi is used, and as the work function adjustment layer 84 for the p-channel FinFET, one or more of TiAlC, Al, TiAl, TaN, TaAlC, TIN, TiC and Co is used.

The conductive layer further includes a main metal layer 86 including a metallic material selected from the group consisting of W, Cu, Ti, Ag, Al, TiAl, TiAlN, TaC, TaCN, TaSiN, Mn, Co, Pd, Ni, Re, Ir, Ru, Pt, and Zr. The metal gate structure for the dummy sacrificial gate structure 40D includes the n-type metal gate structure and/or the p-type metal gate structure.

After forming the metal gate electrodes, further CMOS processes are performed to form various features such as additional interlayer dielectric layers, contacts/vias, interconnect metal layers, and passivation layers, etc.

FIGS. 12-18 show plan views of the various stages of a semiconductor device fabrication process in accordance with embodiments of the present disclosure. Materials, configurations, dimensions, structures, conditions and operations the same as or similar to those explained with FIGS. 1-11 may be employed in the following embodiments, and some of the explanations may be omitted.

Figure 12:
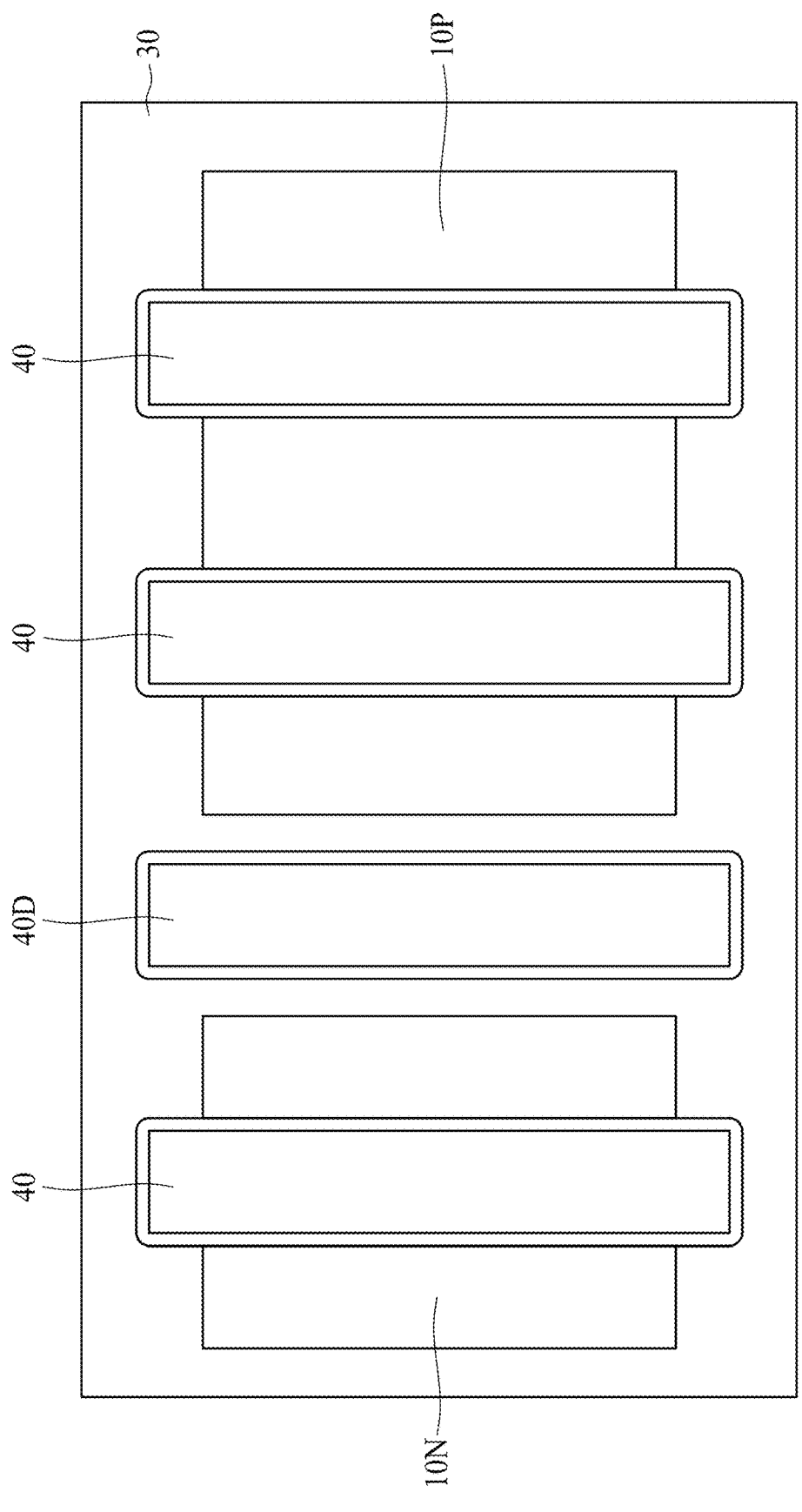
FIG. 12 illustrates a plan view of one of the various stages of a semiconductor device fabrication process in accordance with an embodiment of the present disclosure.
Figure 13:
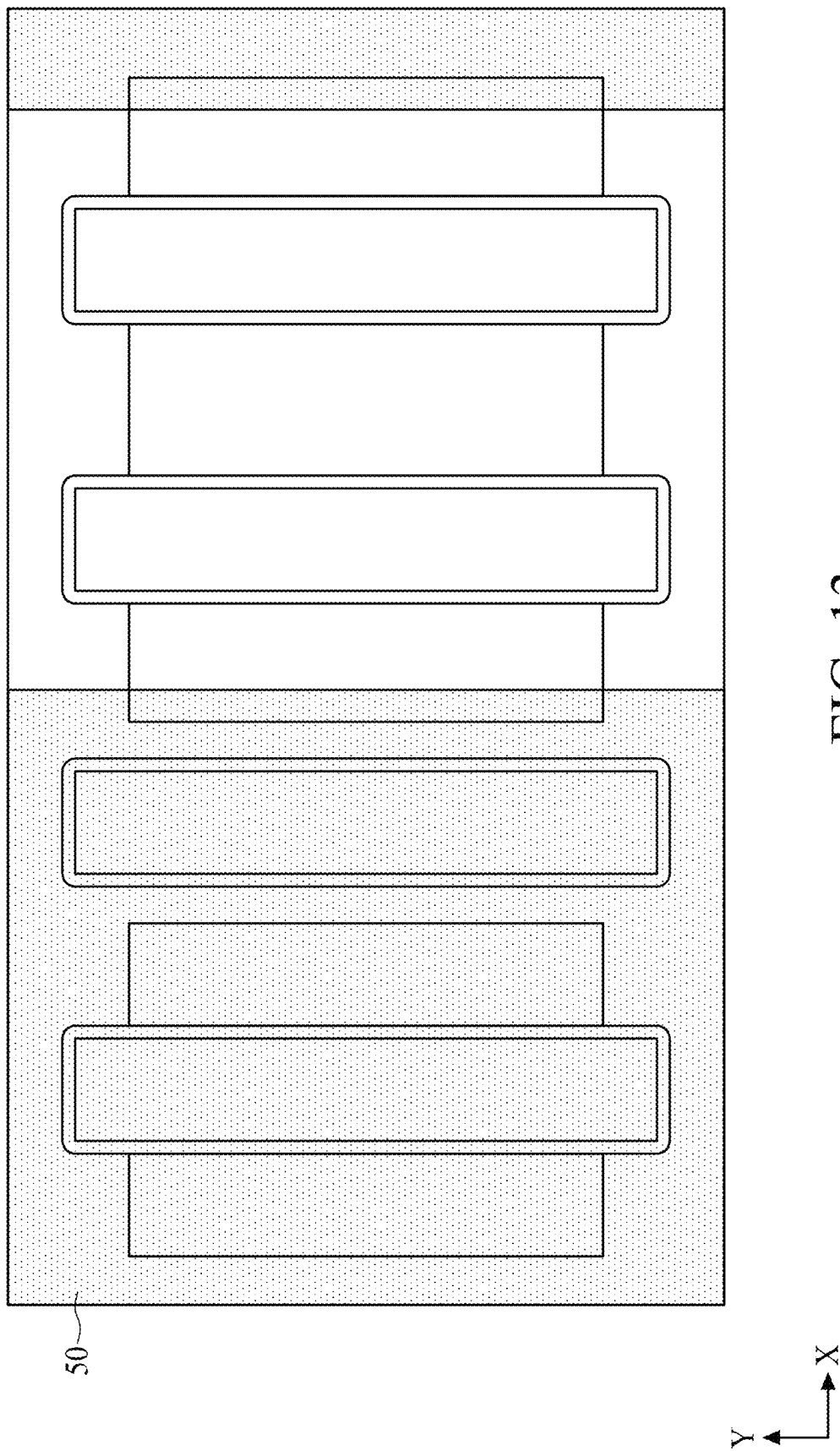
FIG. 13 illustrates a plan view of one of the various stages of a semiconductor device fabrication process in accordance with an embodiment of the present disclosure.
Figure 14:
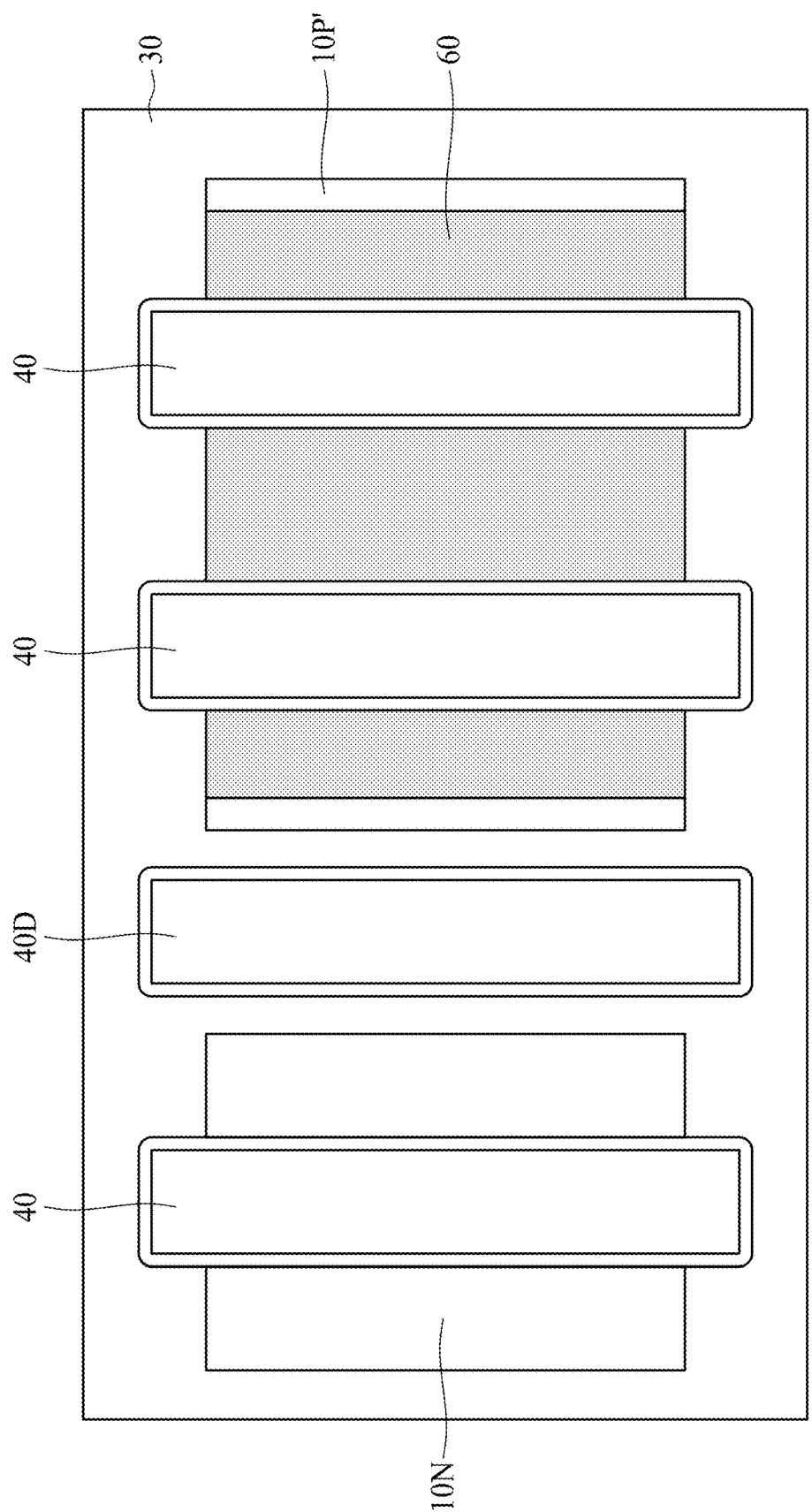
FIG. 14 illustrates a plan view of one of the various stages of a semiconductor device fabrication process in accordance with an embodiment of the present disclosure.

FIG. 12 shows a plan view after sacrificial gate structures 40, 40D are formed. As shown in FIG. 12, the first active region 10P is surrounded by the isolation structure 30, and has vertical edges (extending in the Y direction) and horizontal edges (extending in the X direction). FIG. 13 shows a plan view after the cover layer 50 is formed. As shown in FIG. 13, the cover layer 50 covers the vertical edges (and the corresponding corners) of the first active region 10P and does not cover the horizontal edges except for the corners. FIG. 14 shows a plan view after the source/drain epitaxial layer 60 is formed. As shown in FIG. 14, a thin active region 10P' remains between the source/drain epitaxial layer 60 and the isolation structure in the X direction.

Figure 15:
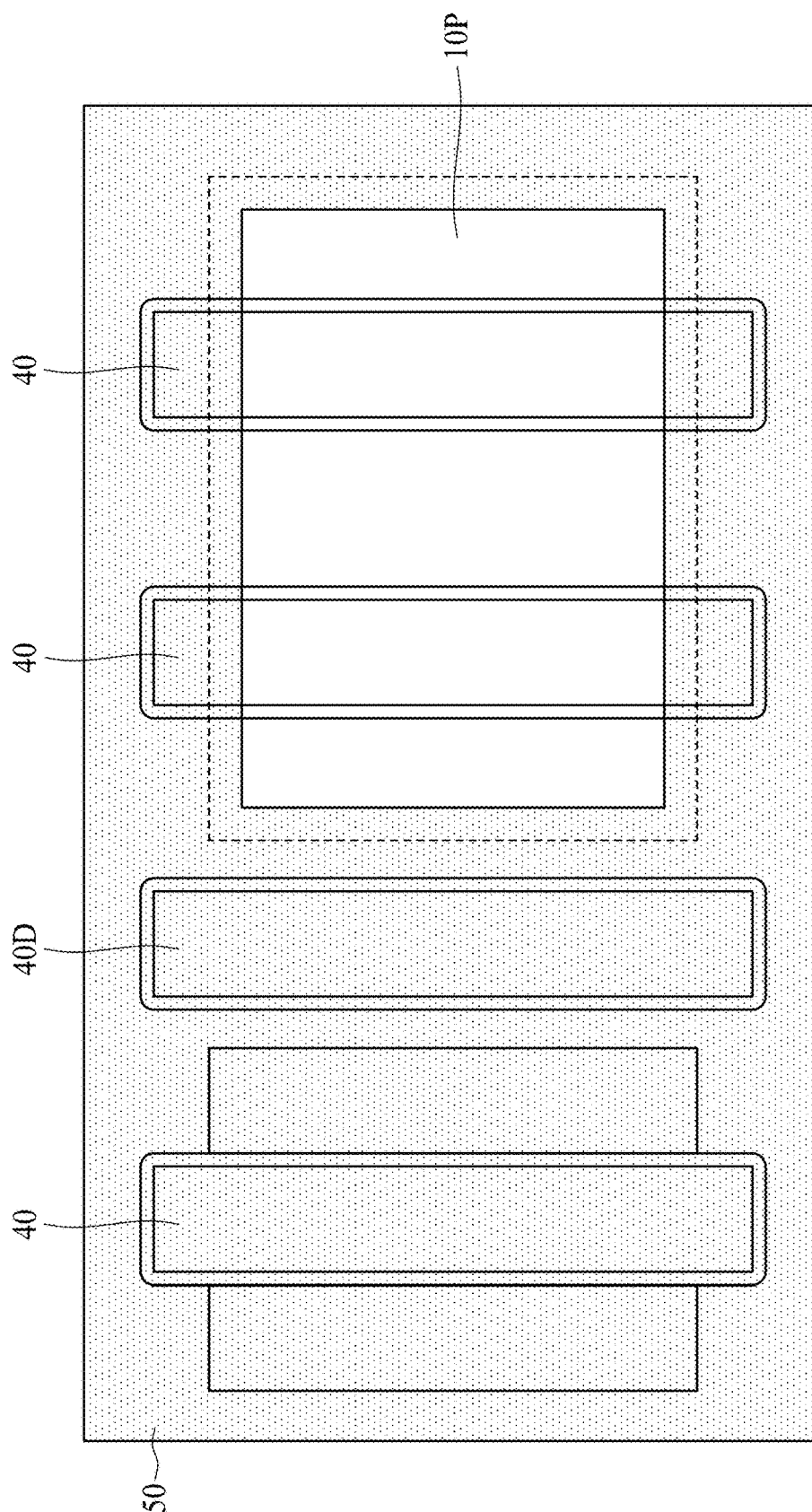
FIG. 15 illustrates a plan view of one of the various stages of a semiconductor device fabrication process in accordance with another embodiment of the present disclosure.
Figure 16:
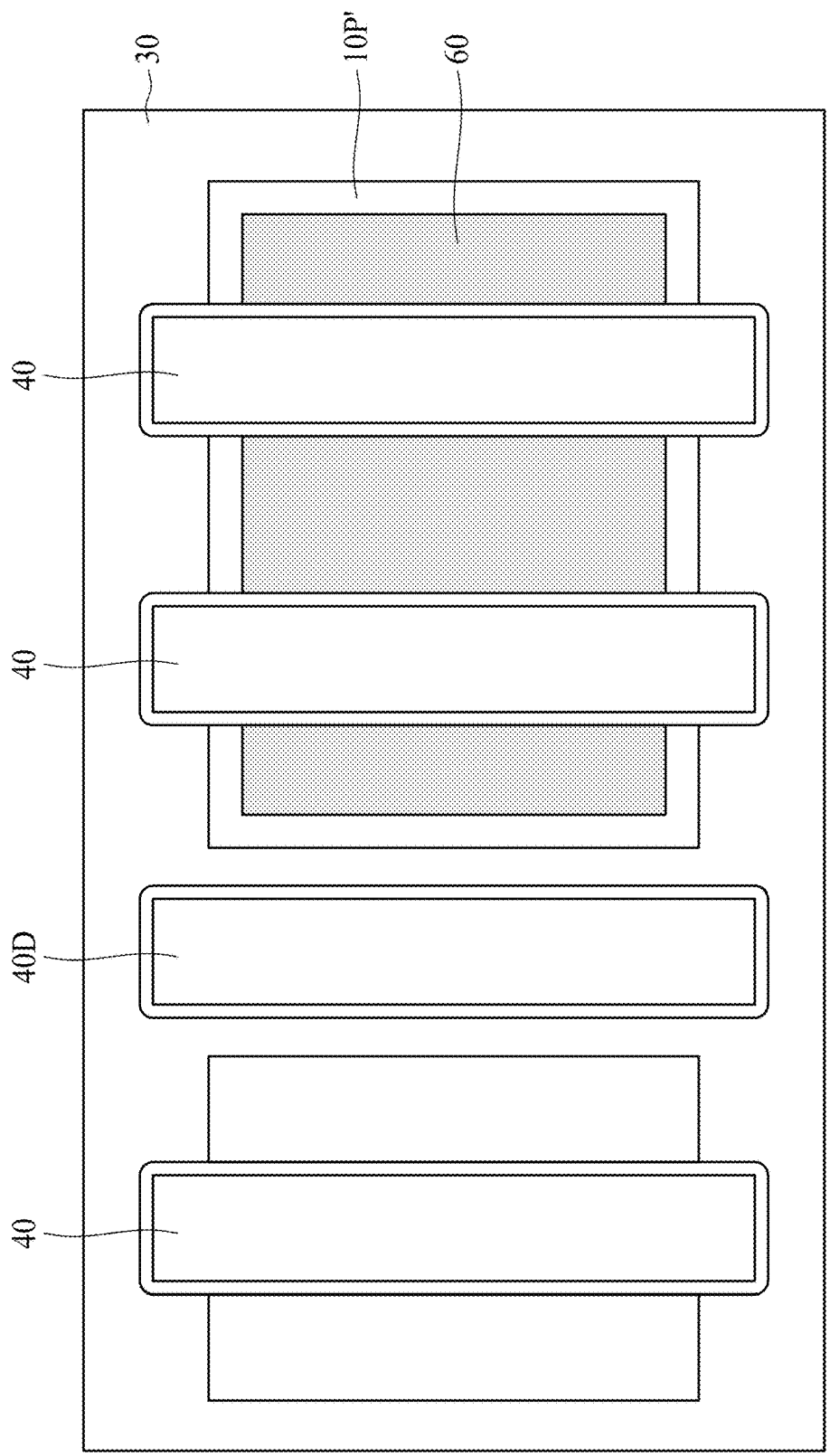
FIG. 16 illustrates a plan view of one of the various stages of a semiconductor device fabrication process in accordance with another embodiment of the present disclosure.

FIG. 15 shows a plan view after the cover layer 50 is formed according to another embodiment. As shown in FIG. 15, the cover layer 50 covers the vertical edges and horizontal edges of the first active region 10P. Thus, as shown in FIG. 16, the source/drain epitaxial layer 60 is fully separated from the isolation structure in the X and Y directions.

Figure 17:
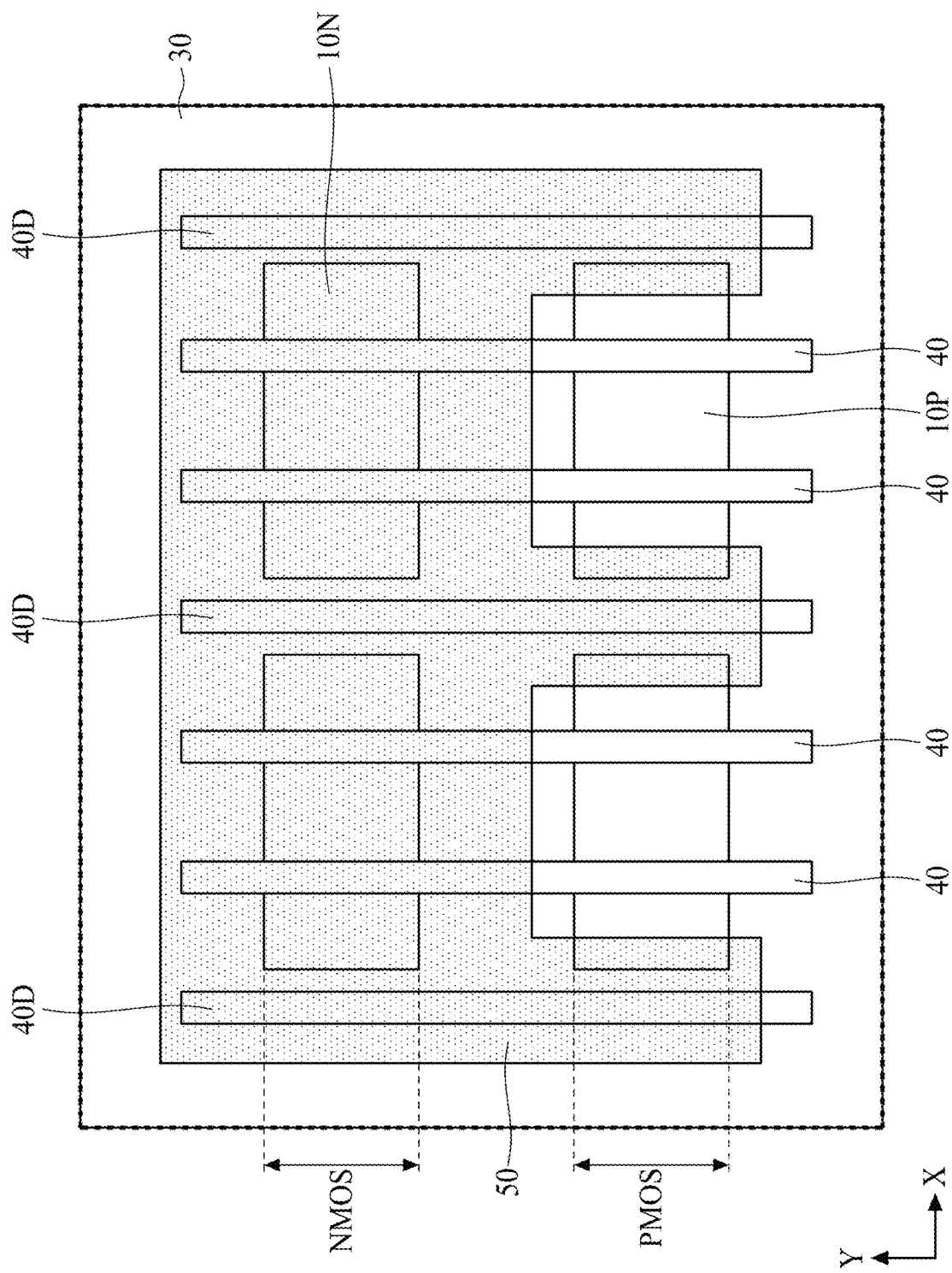
FIG. 17 illustrates a plan view of one of the various stages of a semiconductor device fabrication process in accordance with another embodiment of the present disclosure.
Figure 18:
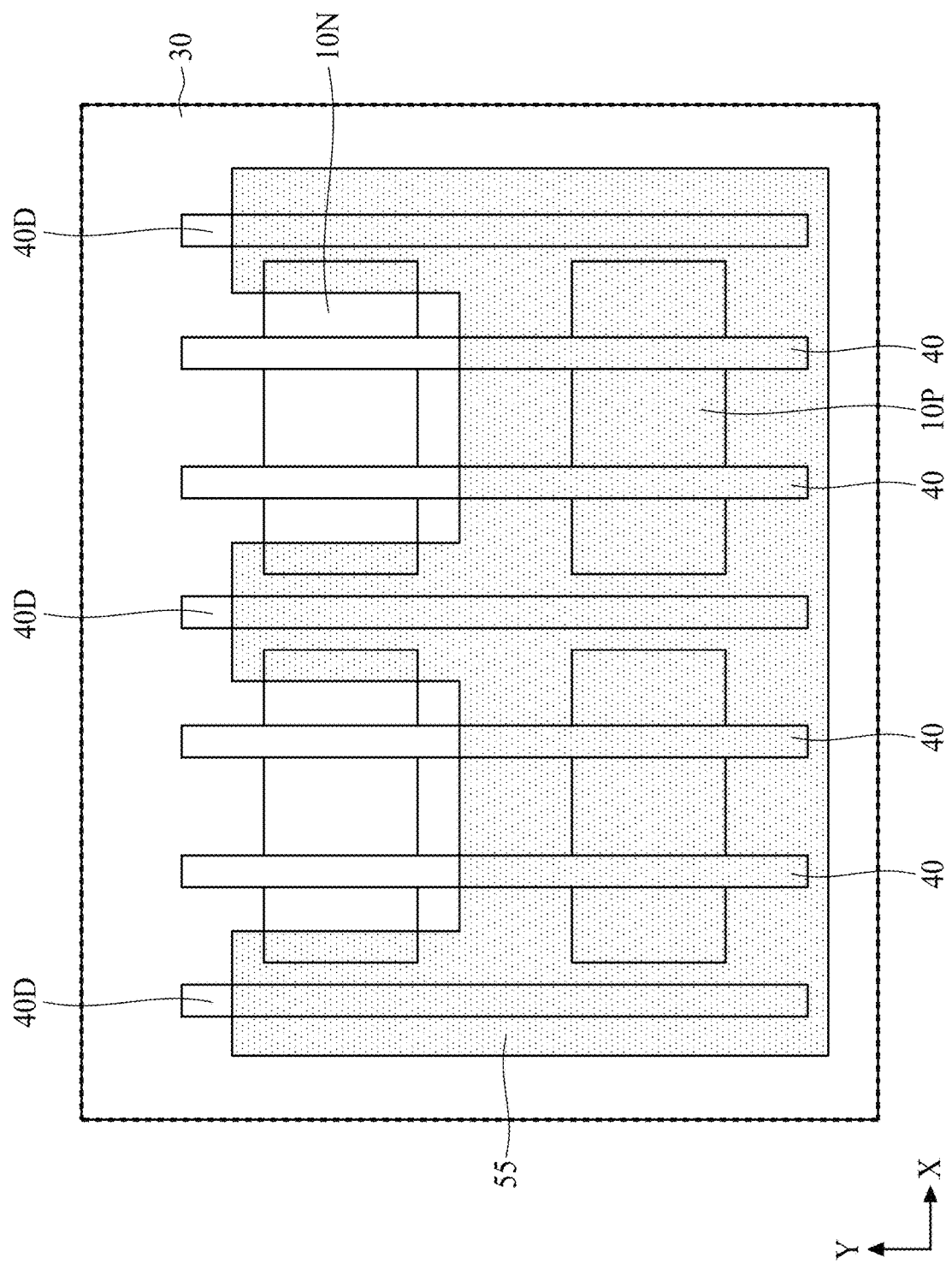
FIG. 18 illustrates a plan view of one of the various stages of a semiconductor device fabrication process in accordance with another embodiment of the present disclosure.

In FIGS. 1-16, the first active region 10P for a p-type FET and the second active region 10N for an n-type FET are arranged side-by-side in the X direction. In FIGS. 17 and 18, the first active region 10P for a p-type FET and the second active region 10N for an n-type FET are arranged in the Y direction in which the sacrificial gate structures extend.

FIG. 17 shows a plan view after the cover layer 50 is formed, and FIG. 18 shows a plan view after the cover layer 55 is formed. Similar to FIG. 13, only the vertical edges of the active regions are covered by the cover layer 50, 55.

Figure 19A:
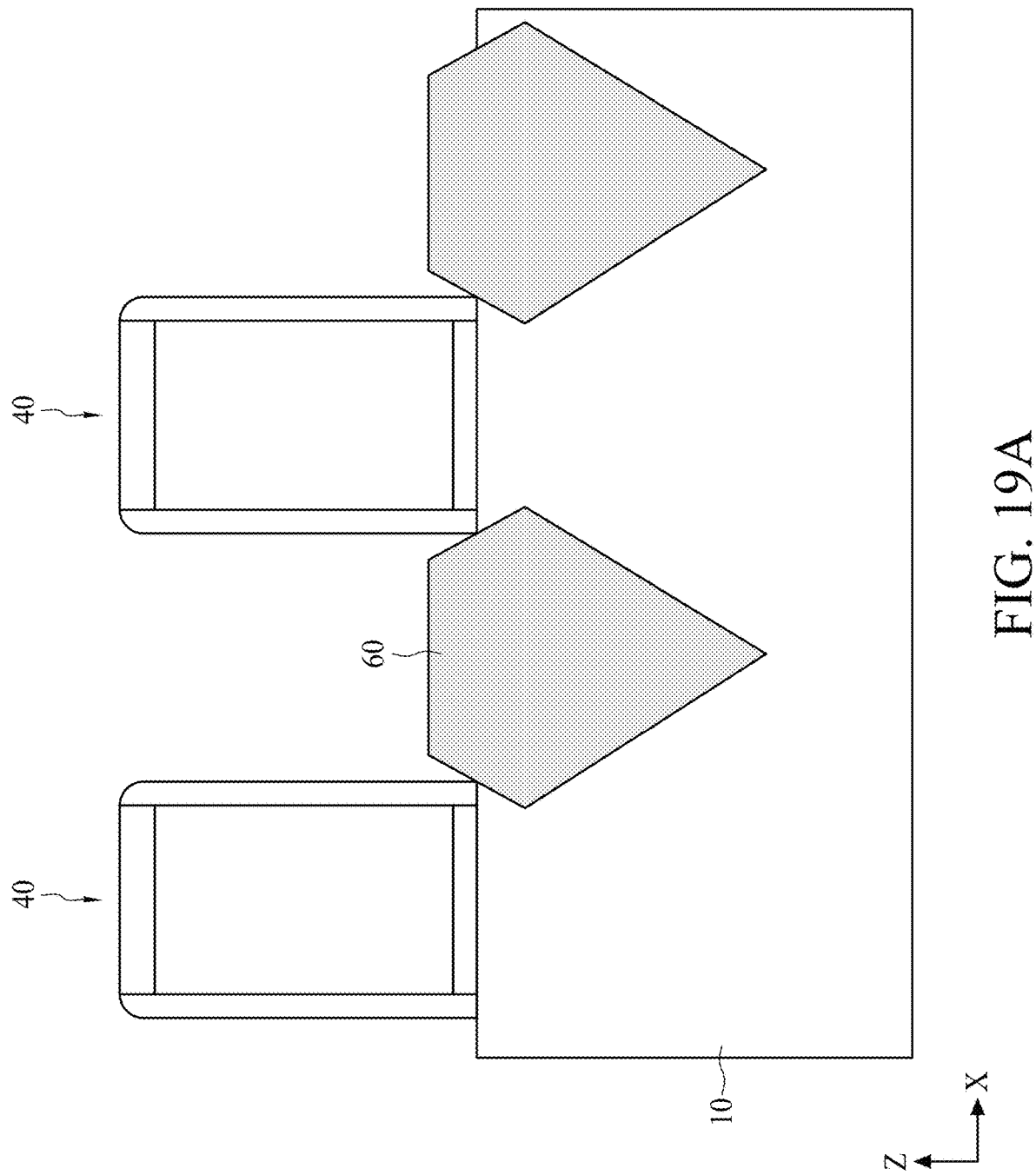
FIGS. 19A, 19B, 19C and 19D illustrate cross sectional views of a source/drain epitaxial layer in accordance with embodiments of the present disclosure.
Figure 19B:
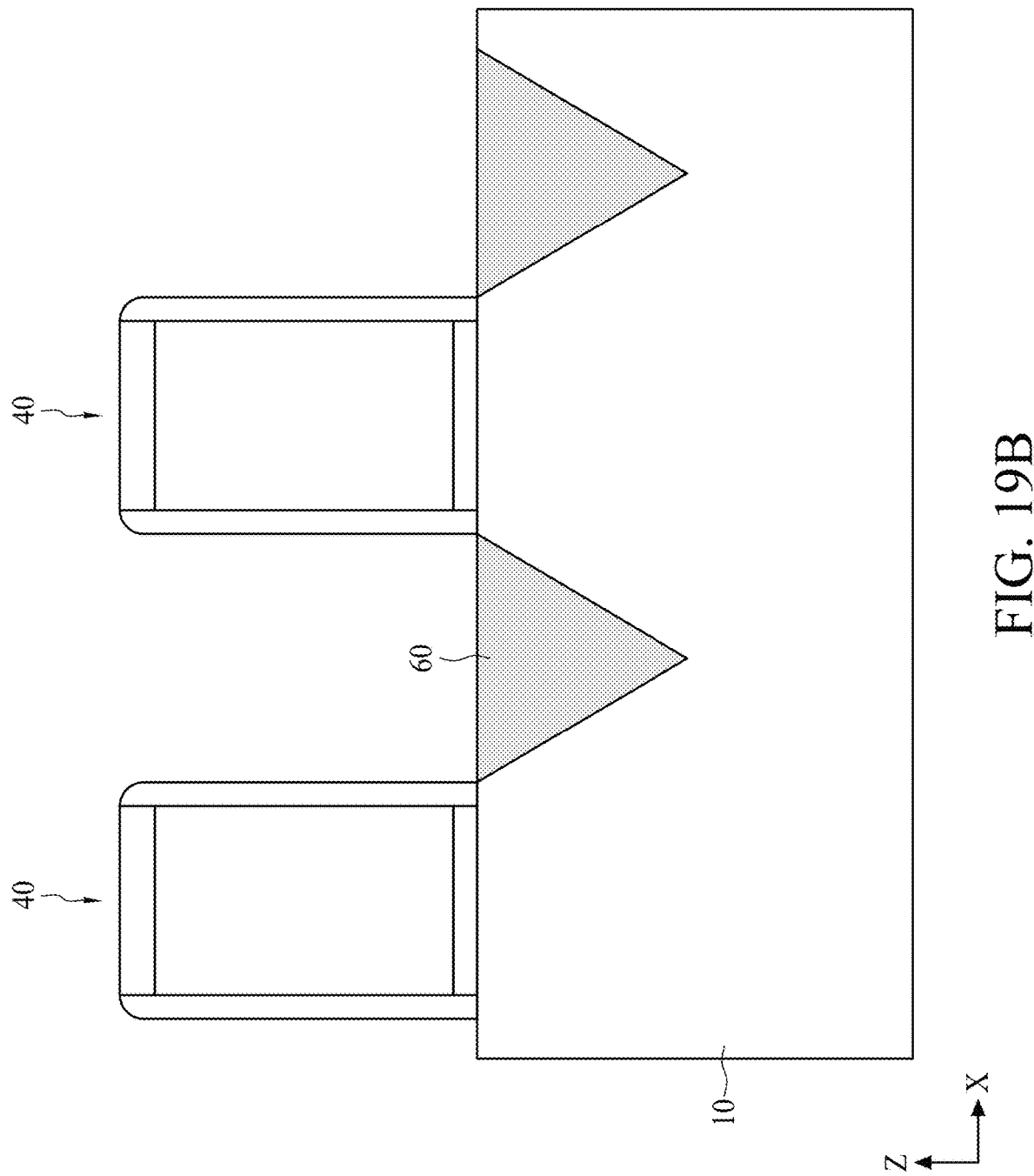
Figure 19C:
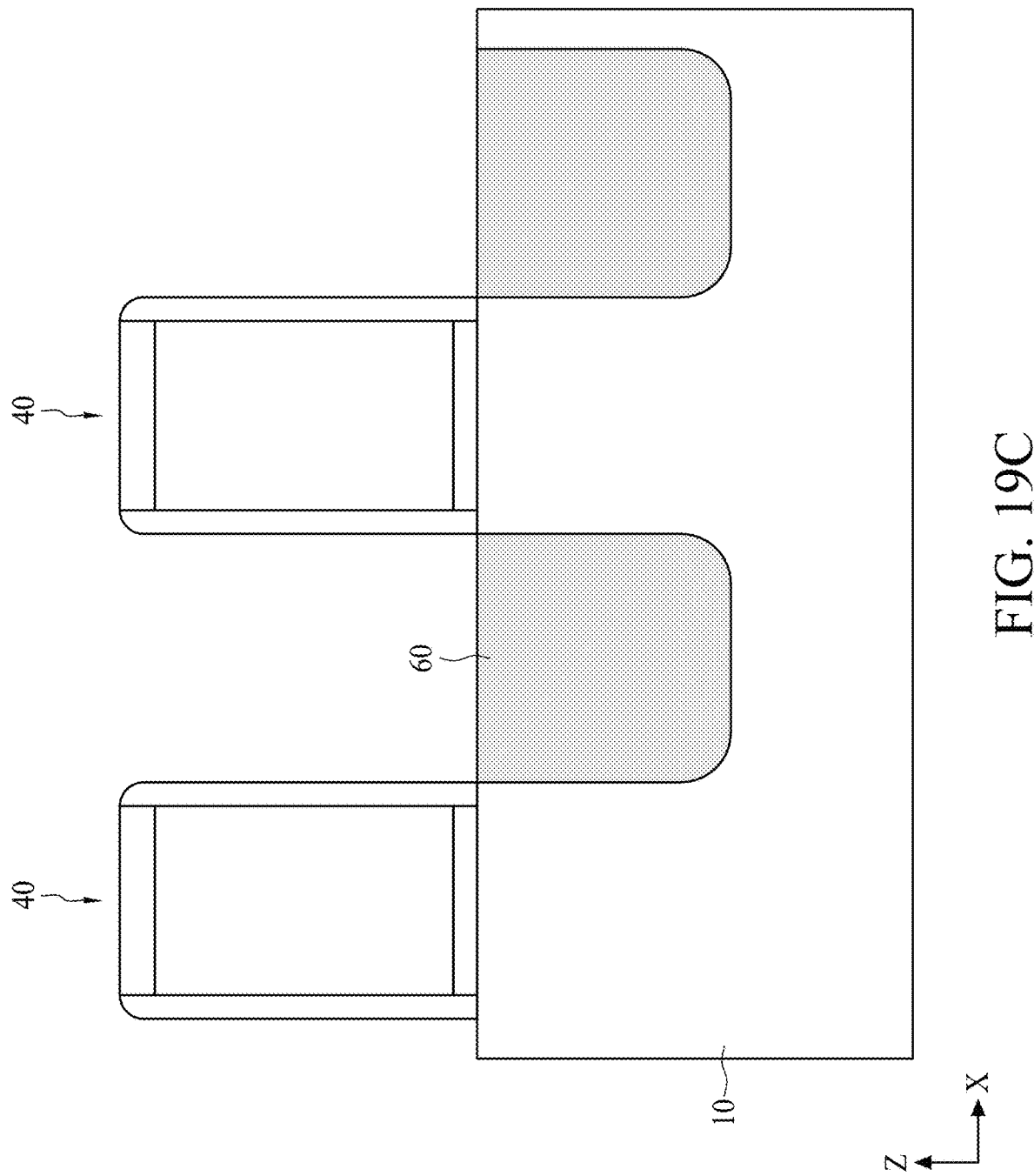
Figure 19D:
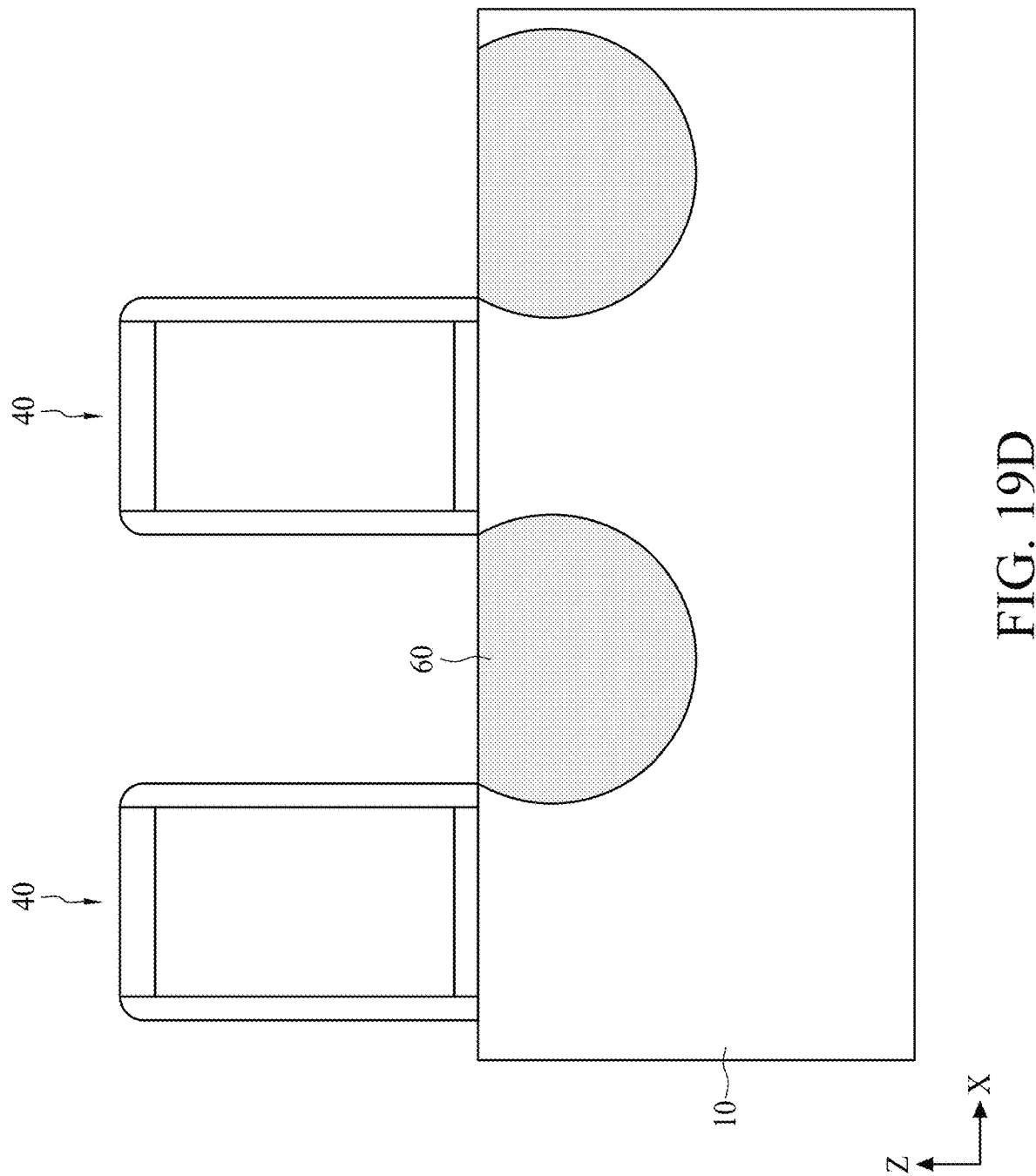

FIGS. 19A, 19B, 19C and 19D illustrate cross sectional views of a source/drain epitaxial layer in accordance with embodiments of the present disclosure. The cross sectional shape of the source/drain epitaxial layer 60, 65 varies depending on etching conditions for forming the recess 12, 14 and/or other factors. In some embodiments, as shown in FIG. 19A, the cross section of the source/drain epitaxial layer has a diamond shape. In some embodiments, as shown in FIG. 19B, the cross section of the source/drain epitaxial layer has a V-shape. In some embodiments, as shown in FIG. 19C, the cross section of the source/drain epitaxial layer has a U-shape. In some embodiments, as shown in FIG. 19D, the cross section of the source/drain epitaxial layer has a semi-circular or rounded shape.

FIGS. 20-28 show cross sectional views of the various stages of a FinFET device fabrication process in accordance with embodiments of the present disclosure. Materials, configurations, dimensions, structures, conditions and operations the same as or similar to those explained with FIGS. 1-19D may be employed in the following embodiments, and some of the explanations may be omitted.

Figure 20:
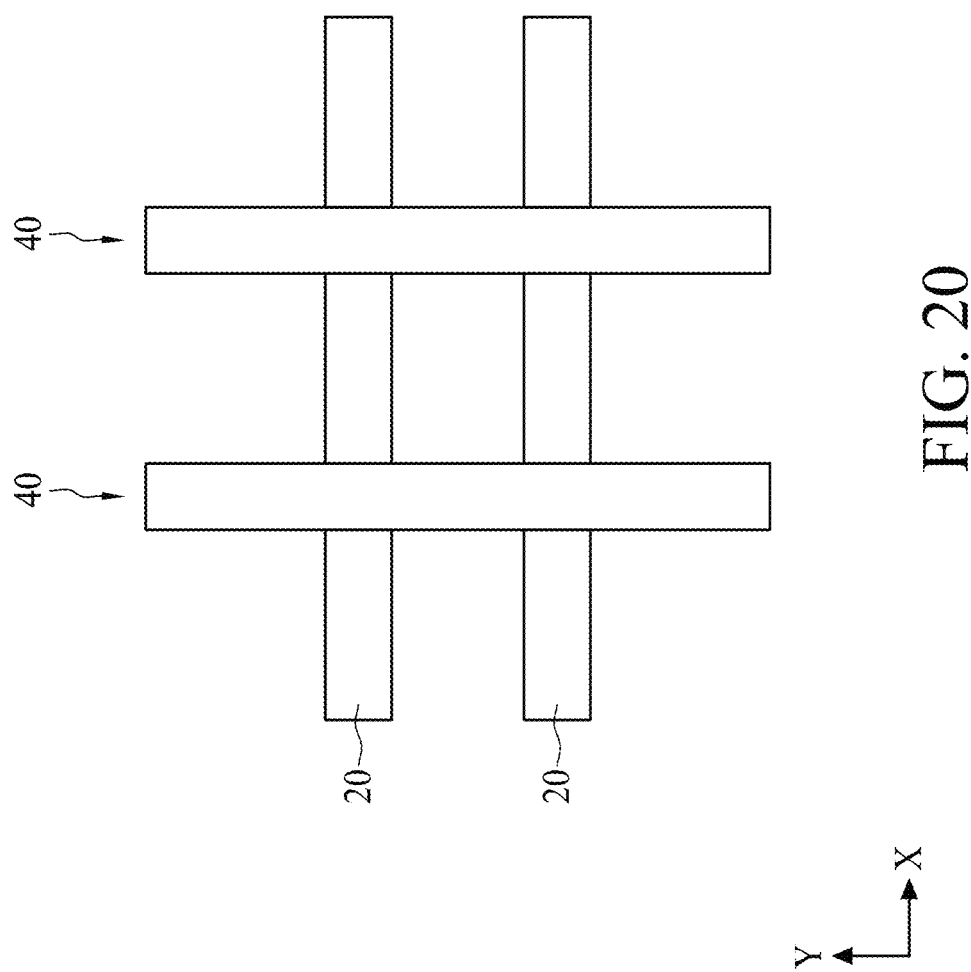
FIG. 20 illustrates a plan view of one of the various stages of a semiconductor device fabrication process in accordance with another embodiment of the present disclosure.

FIG. 20 is a plan view after sacrificial gate structures 40 are formed over fin structures 20. The fin structures 20 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. In some embodiments, one or more dummy fin structures are formed adjacent to the fin structure 20 of an active FinFET.

Figure 21:
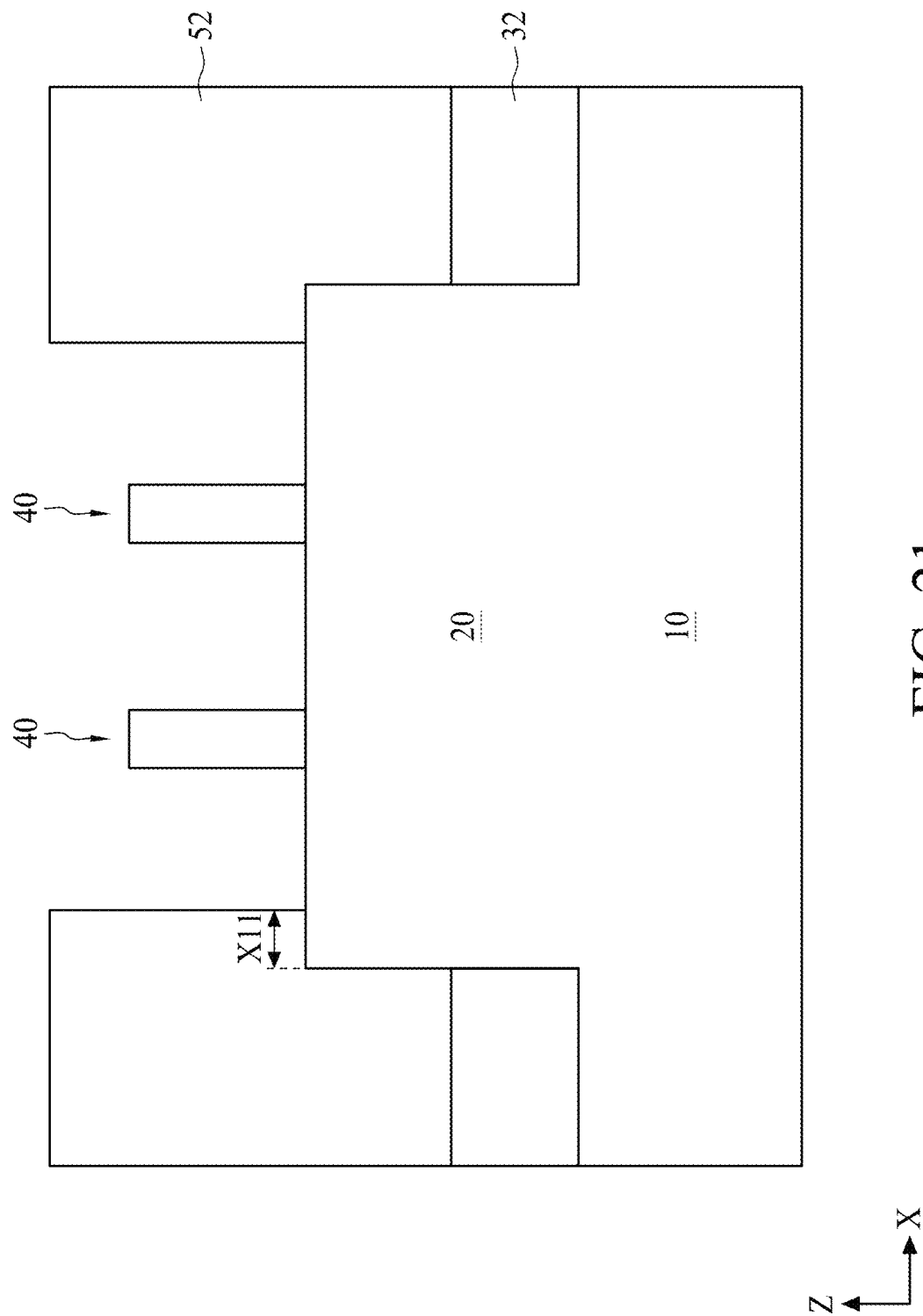
FIG. 21 illustrates a cross sectional view of one of the various stages of a semiconductor device fabrication process in accordance with another embodiment of the present disclosure.

After the fin structures 20 are formed, an isolation insulating layer 32 (e.g., STI), is disposed over the fin structures 20 and the substrate 10 (sec, FIG. 21). Prior to forming the isolation insulating layer 32, one or more liner layers are formed over the substrate 10 and sidewalls of the bottom part of the fin structures 20, in some embodiments. The liner layers may be deposited through one or more processes such as physical vapor deposition (PVD), chemical vapor deposition (CVD), or atomic layer deposition (ALD), although any acceptable process may be utilized. The isolation insulating layer 32 includes one or more layers of insulating materials, for example, silicon dioxide, silicon oxynitride and/or silicon nitride formed by LPCVD (low pressure chemical vapor deposition), plasma-CVD or flowable CVD. The isolation insulating layer 32 may be formed by one or more layers of SOG, SiO, SiON, SiOCN or fluorine-doped silicate glass (FSG) in some embodiments.

After forming the isolation insulating layer 32 over the fin structures 20, a planarization operation is performed so as to remove part of the isolation insulating layer 32 and a mask layer (e.g., a pad oxide layer and a silicon nitride mask layer) which is used to pattern the fin structures. The planarization operation may include a chemical mechanical polishing (CMP) and/or an etch-back process. Subsequently, portions of the isolation insulating layer 32 extending over the top surfaces of the fin structures 20, and portions of the liner layers over the top surfaces of the fin structures 20 are removed using, for example, an etch process, chemical mechanical polishing (CMP), or the like. Further, the isolation insulating layer 32 is recessed to expose the upper portion of the fin structures 20. In some embodiments, the isolation insulating layer 32 is recessed using a single etch processes, or multiple etch processes. In some embodiments in which the isolation insulating layer 32 is made of silicon oxide, the etch process may be, for example, a dry etch, a chemical etch, or a wet cleaning process. In certain embodiments, the partially removing the isolation insulating layer 32 may be performed using a wet etching process, for example, by dipping the substrate in hydrofluoric acid (HF). In another embodiment, the partially removing the isolation insulating layer 32 may be performed using a dry etching process. For example, a dry etching process using $CHF_3$ or $BF_3$ as etching gases may be used. After forming the isolation insulating layer 32, a thermal process, for example, an anneal process, may be performed to improve the quality of the isolation insulating layer 32. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

After the fin structures 20 and the isolation insulating layer 32 are formed, a sacrificial gate structures 40 are formed, as shown in FIG. 20. Each of the sacrificial gate structures 40 include a sacrificial gate dielectric layer, a sacrificial gate electrode layer, a hard mask layer and gate sidewall spacers. Although FIG. 20 shows two fin structures 20 and two sacrificial gate structures 40, the numbers are not limited to two.

Figure 22:
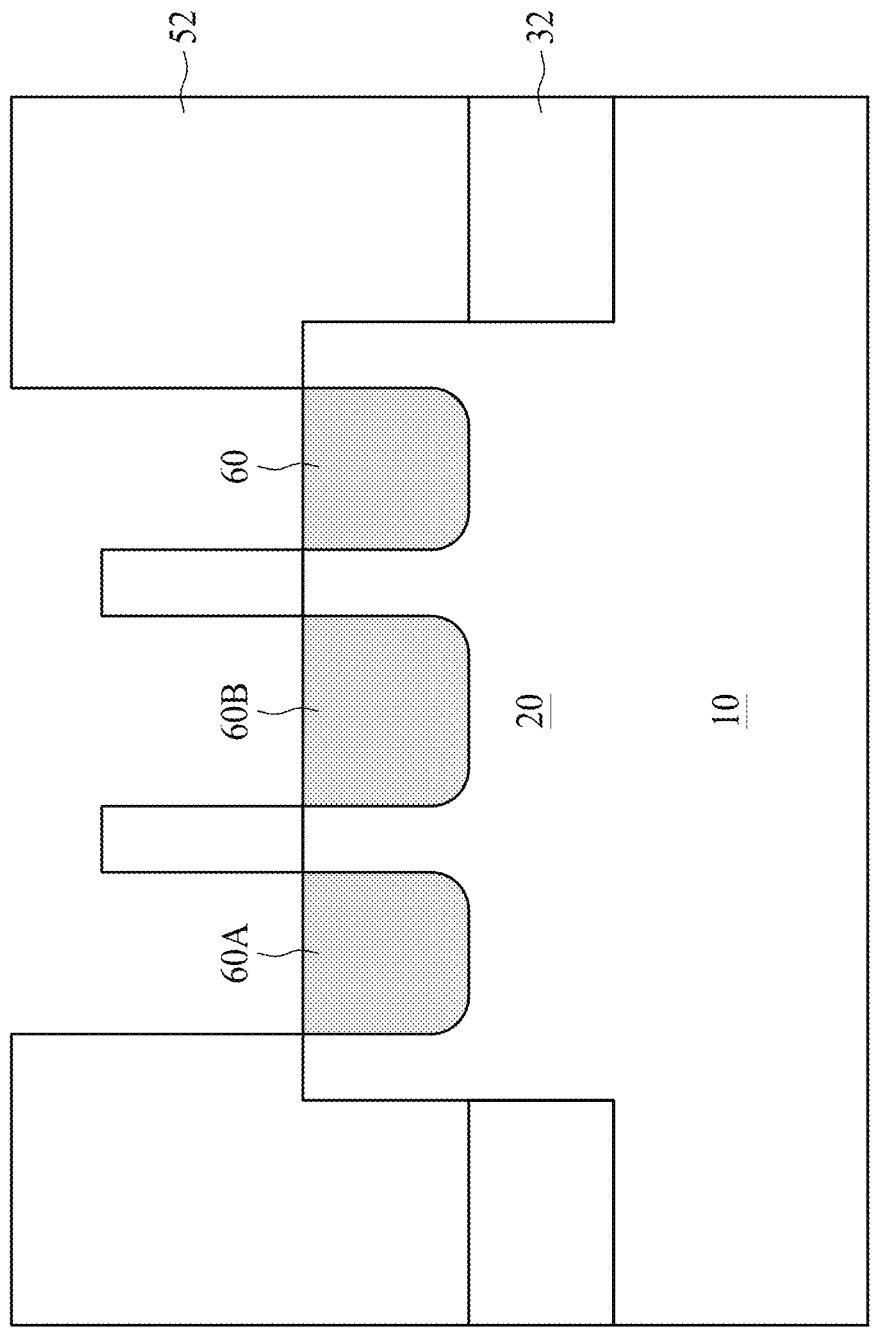
FIG. 22 illustrates a cross sectional view of one of the various stages of a semiconductor device fabrication process in accordance with another embodiment of the present disclosure.

After the sacrificial gate structures 40 are formed, a cover layer 52 is formed to cover edges portions of the fin structure 20 as shown in FIG. 21. The cover layer 52 extends a distance amount X11 over the top of the fin structure 20 in a range from 10 nm to 30 nm in some embodiments, and in a range from about 15 nm to about 25 nm in other embodiments, depending on the design rule of the semiconductor device. After the cover layer 52 is formed, the fin structure 20 not covered by the cover layer 52 and the sacrificial gate structures 40 are etched (recessed) to form a source/drain space, and an source/drain epitaxial layer 60 is formed in the source/drain space, as shown in FIG. 22.

The source/drain epitaxial layer 60A formed near the edge of the fin structure 20 is smaller in volume than the source/drain epitaxial layer 60B formed between the adjacent sacrificial gate structures 40. In some embodiments, the depth of the source/drain epitaxial layer 60A is about 80% to about 95% of the depth of the source/drain epitaxial layer 60B, and is about 85% to about 90% of the depth of the source/drain epitaxial layer 60B in other embodiments. In some embodiments, the maximum width of the source/drain epitaxial layer 60A is about 40% to about 65% of the maximum width of the source/drain epitaxial layer 60B, and is about 50% to about 60% of the maximum width of source/drain epitaxial layer 60B in other embodiments.

Figure 23:
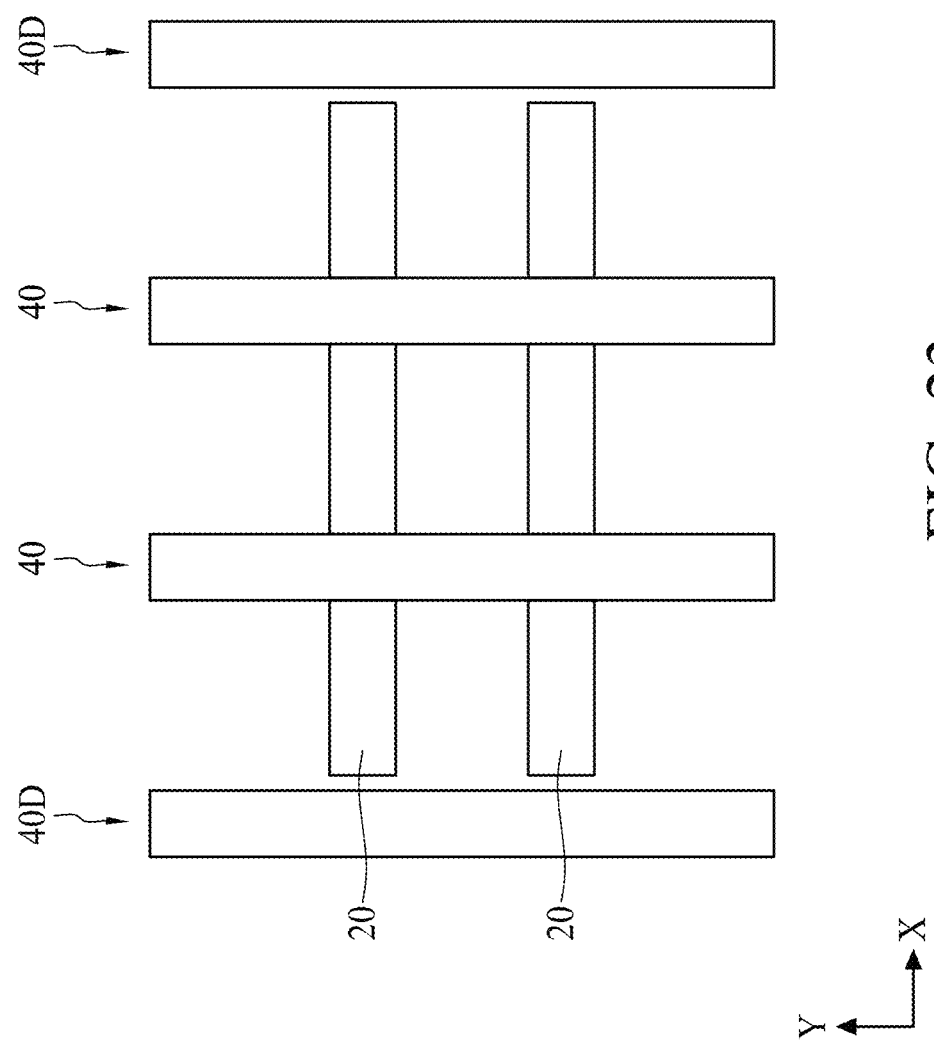
FIG. 23 illustrates a plan view of one of the various stages of a semiconductor device fabrication process in accordance with another embodiment of the present disclosure.
Figure 24:
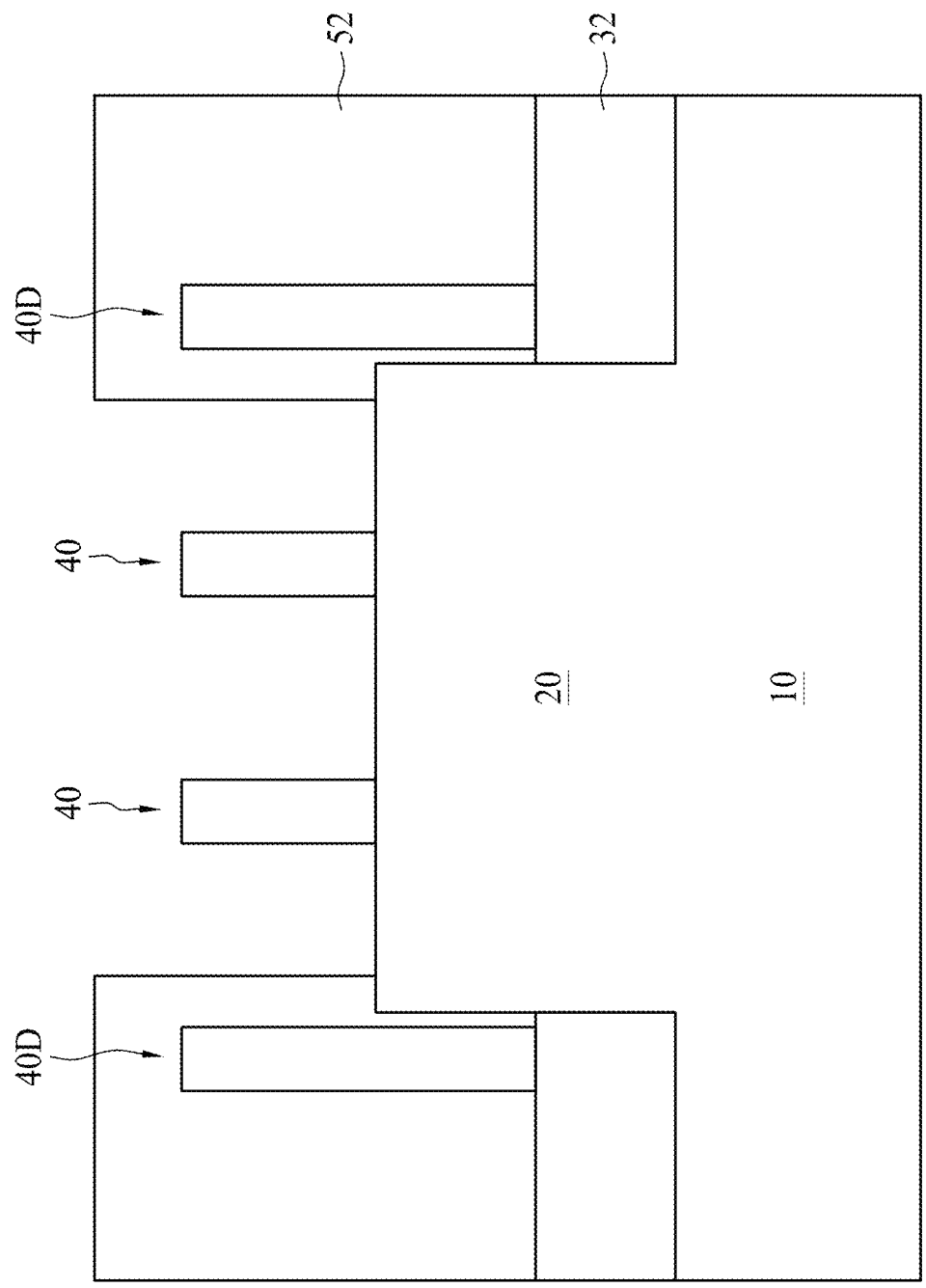
FIG. 24 illustrates a cross sectional view of one of the various stages of a semiconductor device fabrication process in accordance with another embodiment of the present disclosure.
Figure 25:
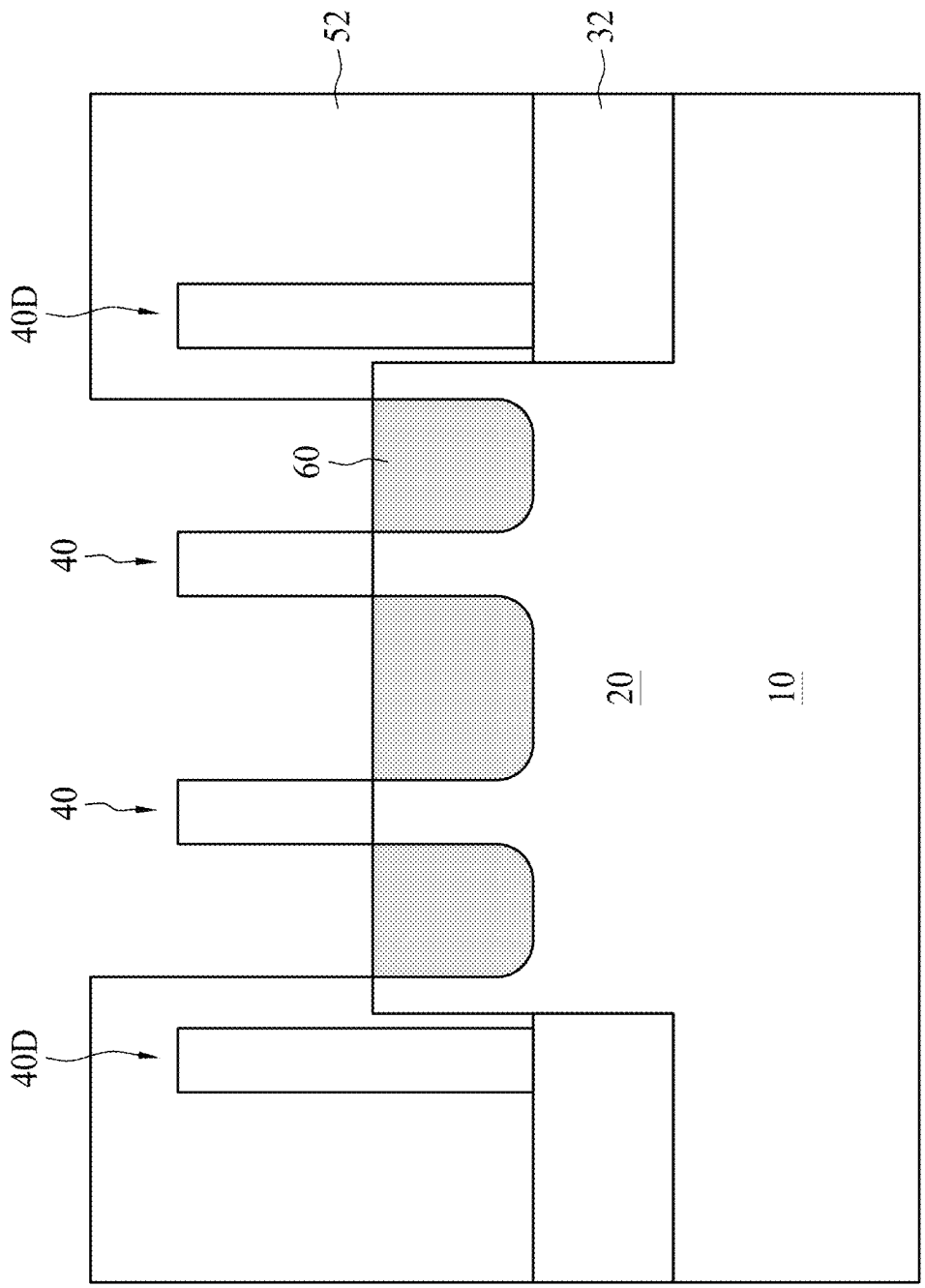
FIG. 25 illustrates a cross sectional view of one of the various stages of a semiconductor device fabrication process in accordance with another embodiment of the present disclosure.

FIG. 23 is a plan view after sacrificial gate structures 40 and dummy sacrificial gate structures 40D are formed over the fin structures 20. As shown in FIG. 25, the dummy sacrificial gate structures 40D do not cover the edge of the fin structure 20. Similar to FIG. 21, the cover layer 52 is formed to cover the edge portions of the fin structure 20, as shown in FIG. 24. Similar to FIG. 22, the source/drain epitaxial layer 60 is formed as shown in FIG. 25. The configuration of the source/drain epitaxial layer 60 of FIG. 25 is substantially the same as the configuration of the source/drain epitaxial layer 60 of FIG. 22.

Figure 26:
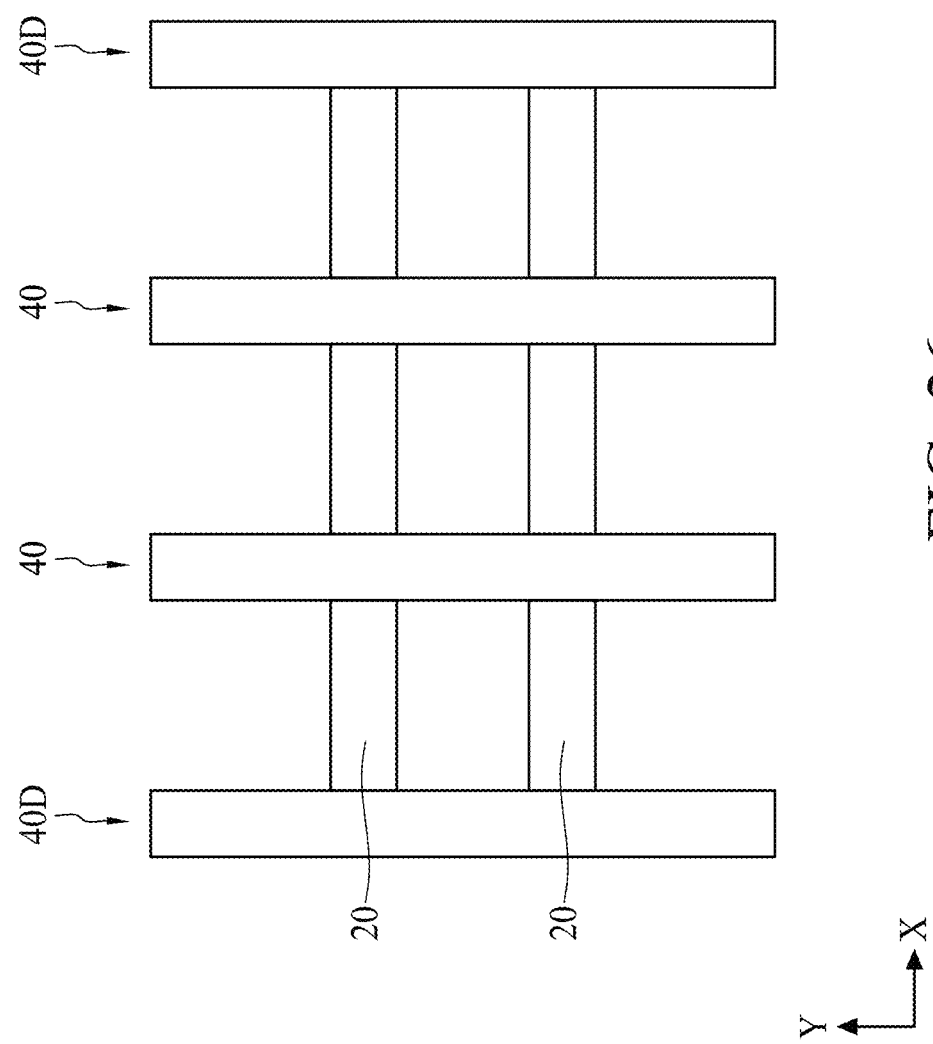
FIG. 26 illustrates a plan view of one of the various stages of a semiconductor device fabrication process in accordance with another embodiment of the present disclosure.
Figure 27:
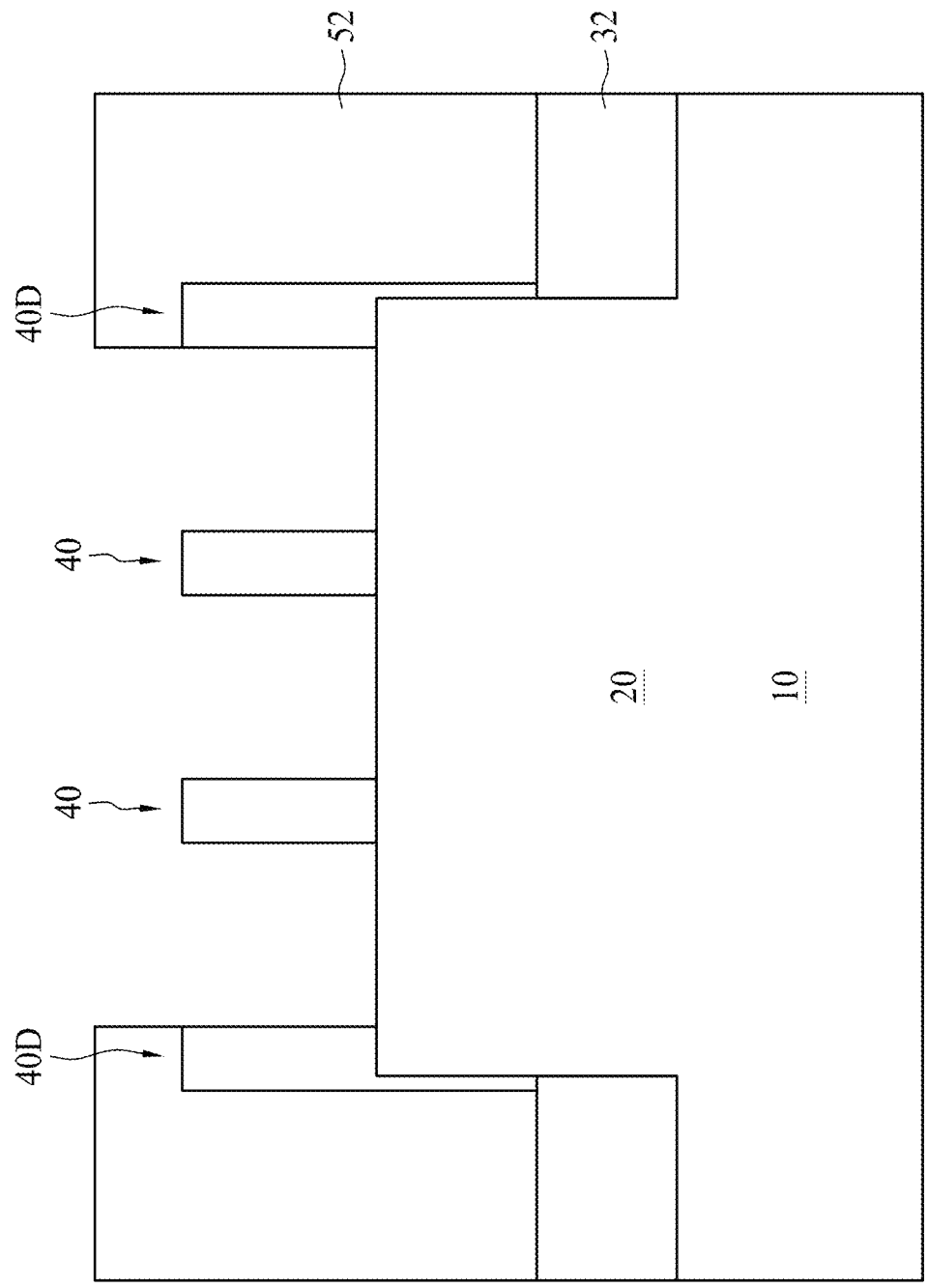
FIG. 27 illustrates a cross sectional view of one of the various stages of a semiconductor device fabrication process in accordance with another embodiment of the present disclosure.
Figure 28:
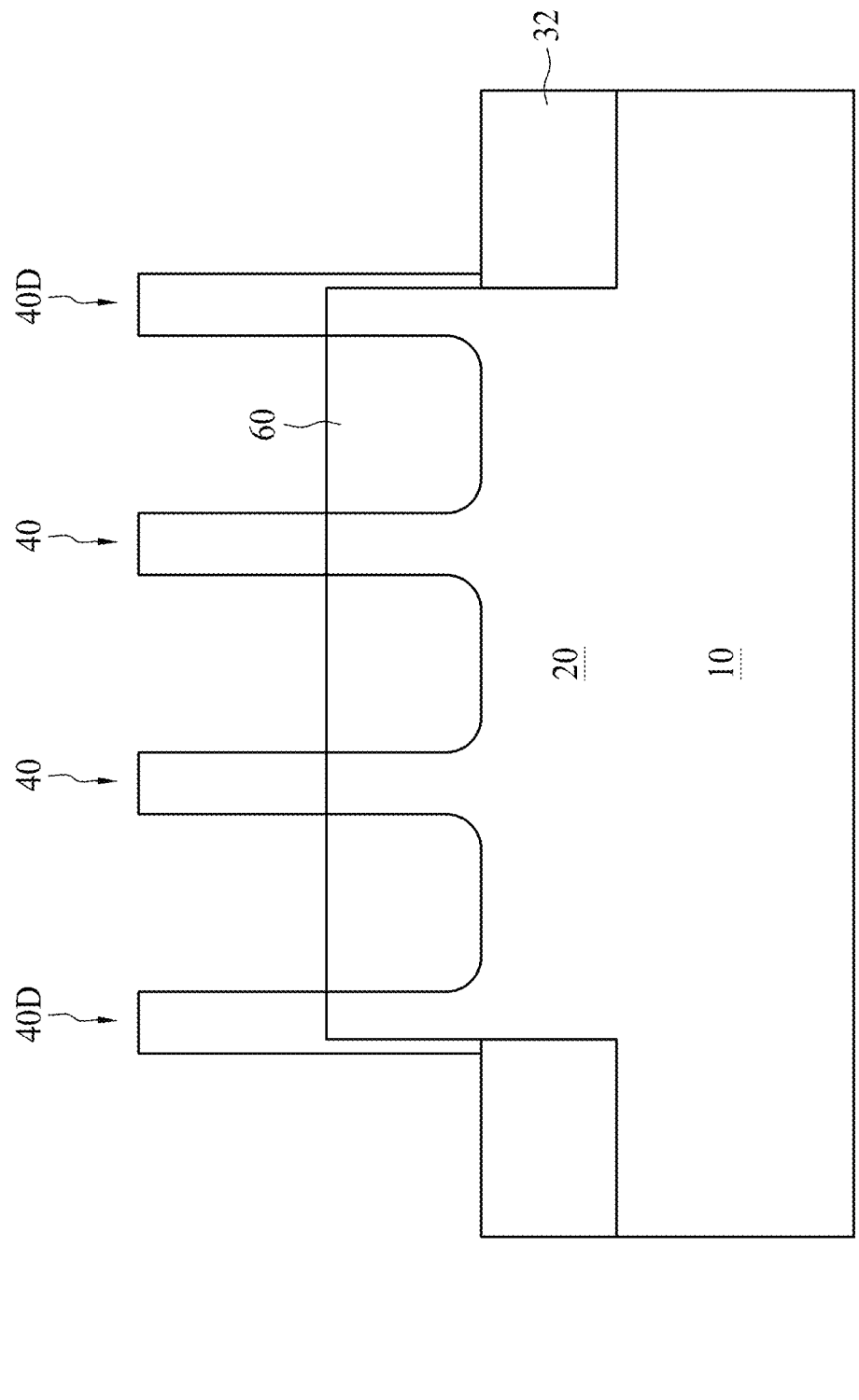
FIG. 28 illustrates a cross sectional view of one of the various stages of a semiconductor device fabrication process in accordance with another embodiment of the present disclosure.

FIG. 26 is a plan view after sacrificial gate structures 40 and dummy sacrificial gate structures 40D are formed over fin structures 20. As shown in FIG. 26, the dummy sacrificial gate structures 40D cover the edges of the fin structure 20, respectively. As shown in FIG. 27, the cover layer 52 is formed so that the edge of the cover layer is located on the dummy sacrificial gate structure 40D, and then the source/drain epitaxial layer 60 is formed as shown in FIG. 28. In this embodiment, the size of the three source/drain epitaxial layers are substantially equal to each other.

Figure 29:
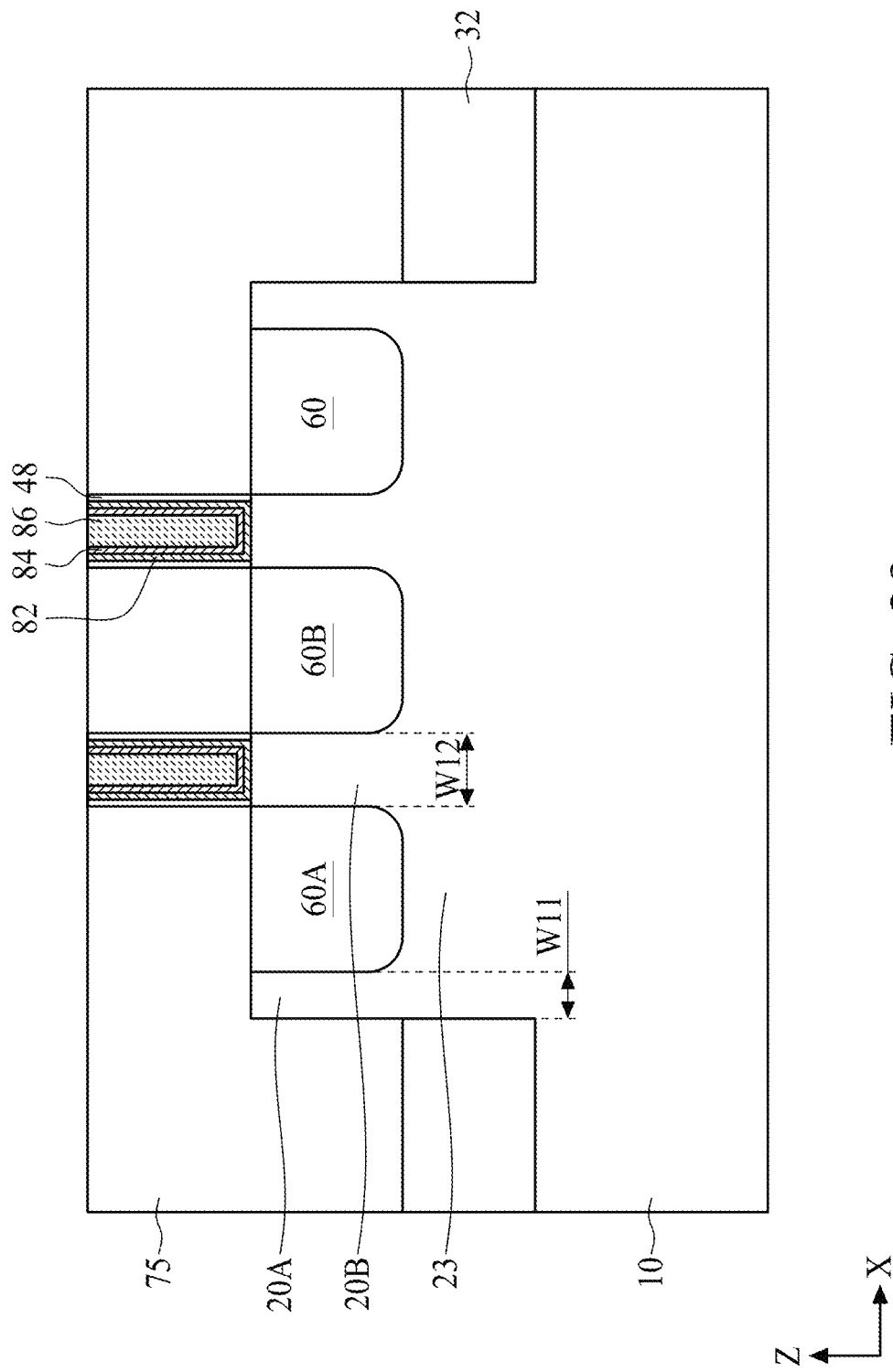
FIG. 29 illustrates a cross sectional of one of the various stages of a semiconductor device fabrication process in accordance with another embodiment of the present disclosure.

FIG. 29 shows a FinFET after a metal gate structure is formed in accordance with an embodiment. As shown in FIG. 29, the fin structure includes a channel fin structure 20B and an edge fin structure 20A disposed over a bottom fin structure 23. The metal gate structure is disposed over the channel fin structure 20B. A source/drain epitaxial layer 60A is disposed between the channel fin structure 20B and the edge fin structure 20A, and a source/drain epitaxial layer 60B is disposed between the channel fin structures 20B. In some embodiments, the width W11 of the edge fin structure 20A is in a range from 5 nm to 30 nm. In some embodiments, the width W11 of the edge fin structure 20A is smaller than the width W12 of the channel fin structure 20B.

FIGS. 30-34 show cross sectional views of the various stages of a GAA FET device fabrication process in accordance with embodiments of the present disclosure. Materials, configurations, dimensions, structures, conditions and operations the same as or similar to those explained with FIGS. 1-29 may be employed in the following embodiments, and some of the explanations may be omitted.

Figure 30:
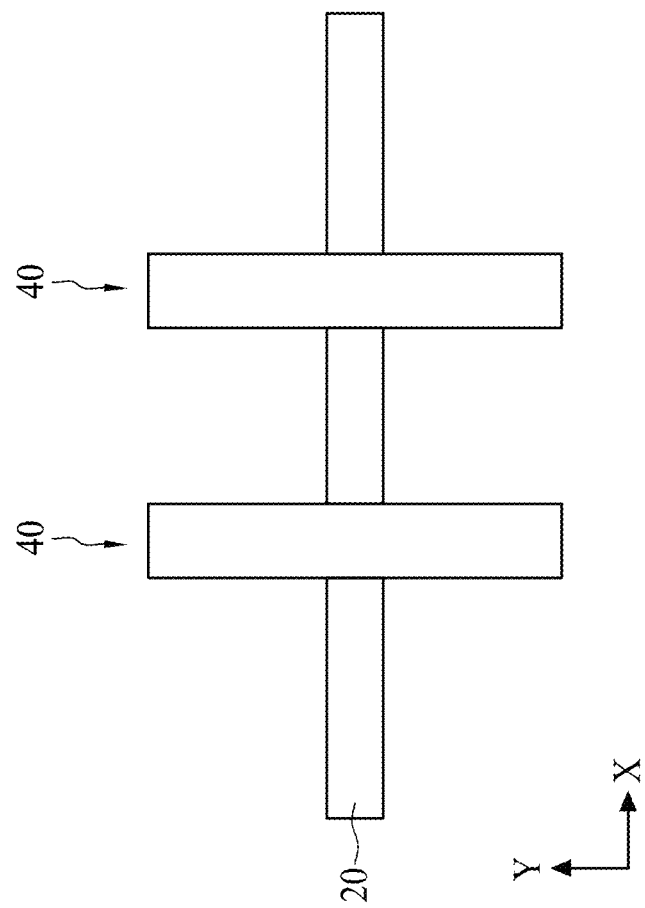
FIG. 30 illustrates a plan view of one of the various stages of a semiconductor device fabrication process in accordance with another embodiment of the present disclosure.
Figure 31:
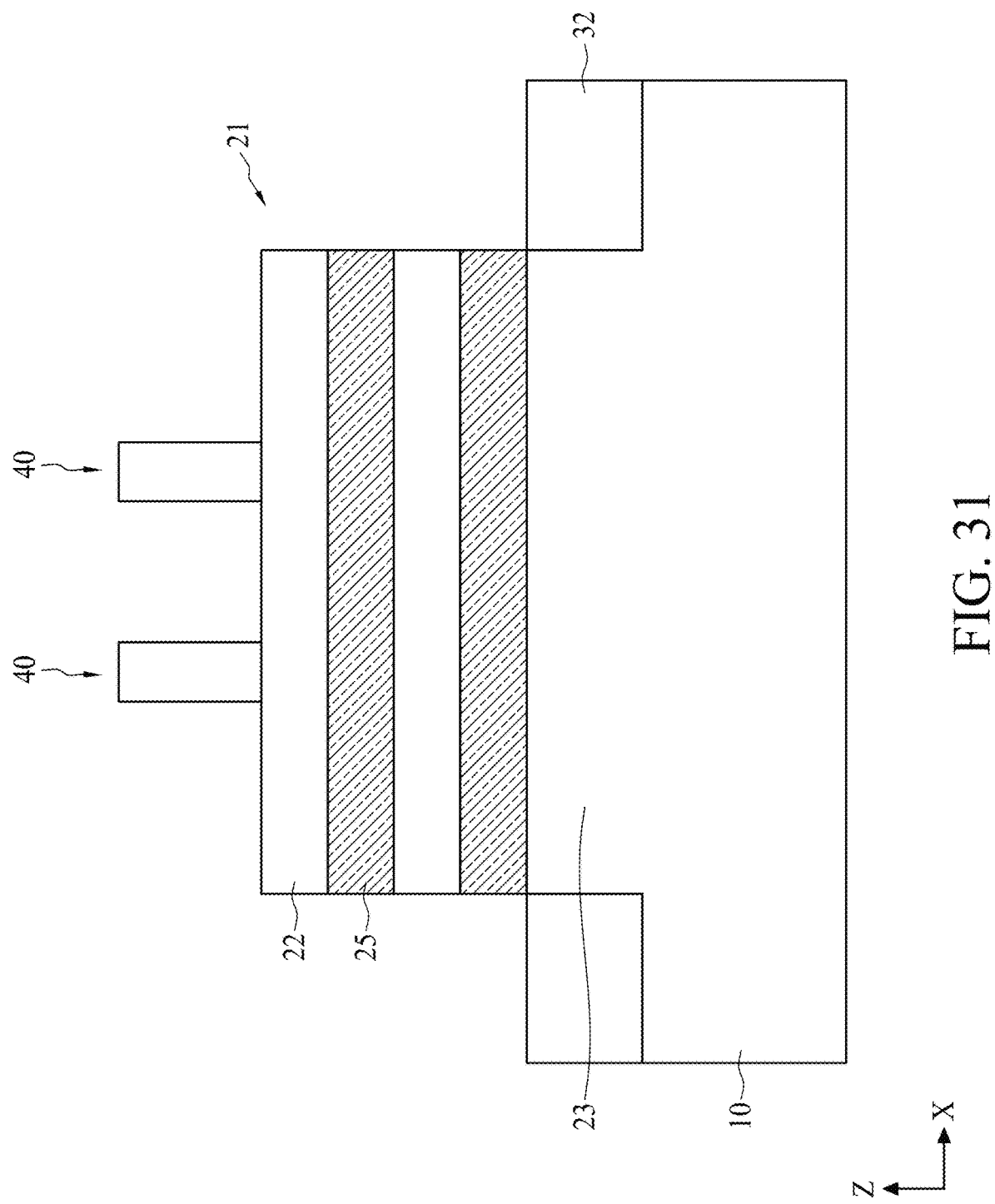
FIG. 31 illustrates a cross sectional view of one of the various stages of a semiconductor device fabrication process in accordance with another embodiment of the present disclosure.

FIG. 30 is a plan view and FIG. 31 is a cross sectional view after sacrificial gate structures 40 are formed over fin structures 21. The fin structure 21 includes first semiconductor layers 25 and second semiconductor layers 22 alternately stacked over a fin bottom structure 23 as shown in FIG. 31. In some embodiments, the first semiconductor layers 25 are made of SiGe and the second semiconductor layers 22 are made of Si.

Figure 32:
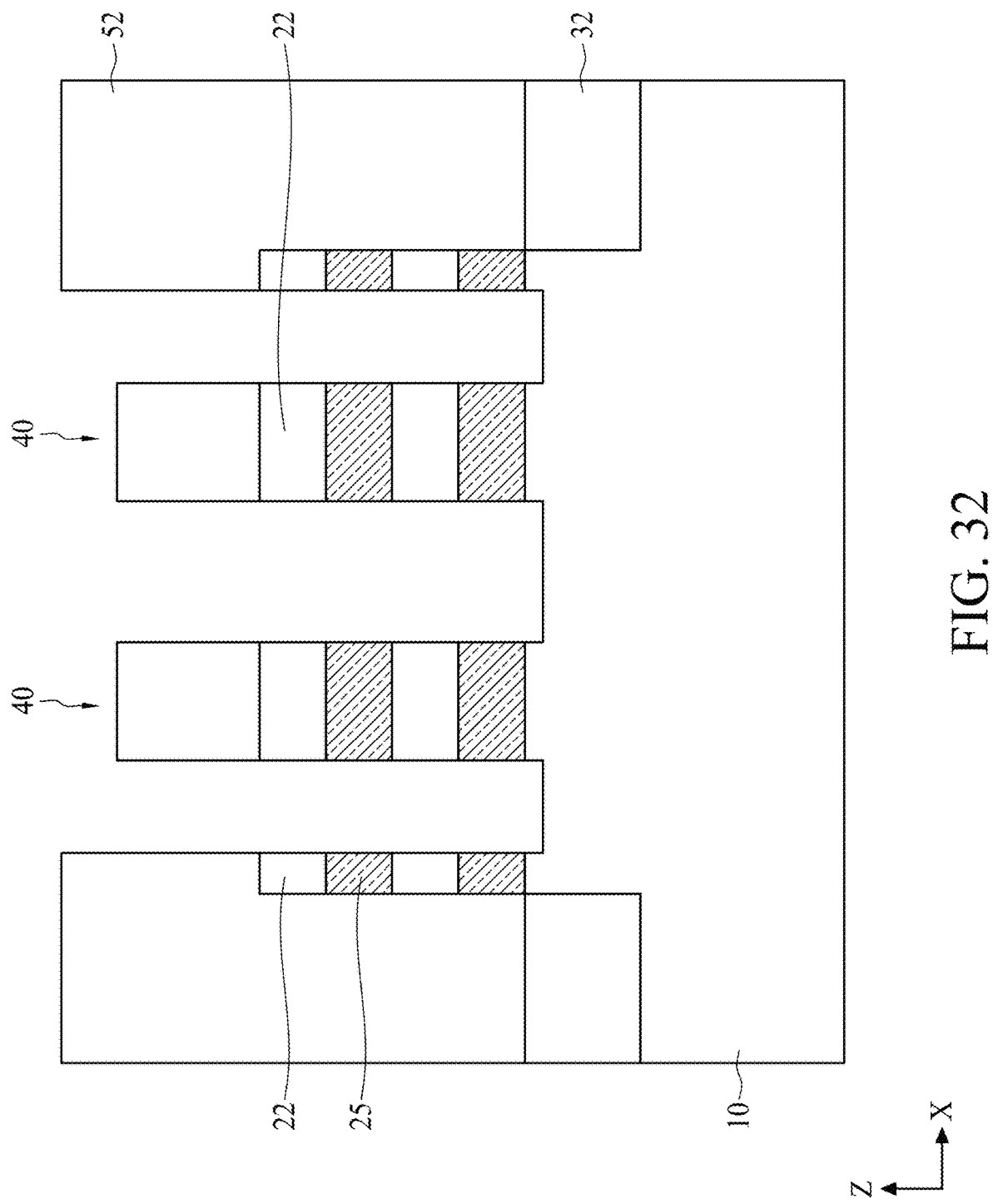
FIG. 32 illustrates a cross sectional view of one of the various stages of a semiconductor device fabrication process in accordance with another embodiment of the present disclosure.
Figure 33:
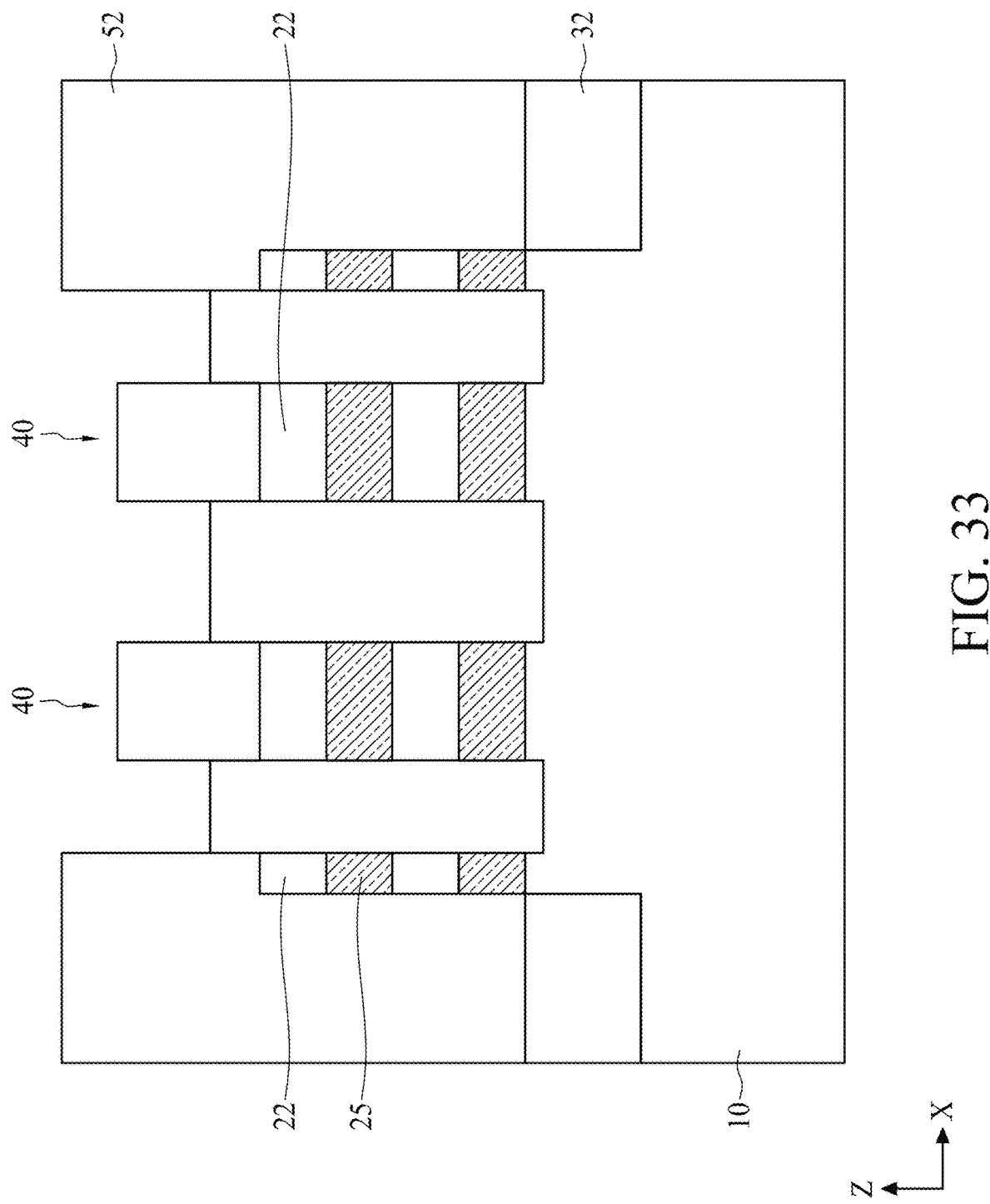
FIG. 33 illustrates a cross sectional view of one of the various stages of a semiconductor device fabrication process in accordance with another embodiment of the present disclosure.

As shown in FIG. 32, a cover layer 52 is formed to cover the edge portions of the fin structure, and the fin structure not covered by the cover layer 52 and the sacrificial gate structures 40 are etched (recessed) to form a source/drain space, as shown in FIG. 32. Then, as shown in FIG. 33, a source/drain epitaxial layer 60 is formed in the source/drain space.

Further, the sacrificial gate structures 40 are replaced with metal gate structures. After the ILD layer 75 is formed, a CMP operation is performed to expose the sacrificial gate electrode layer. The sacrificial gate electrode layer and the sacrificial gate dielectric layer are then removed, thereby exposing the fin structure. When the sacrificial gate electrode layer is polysilicon, a wet etchant such as a TMAH solution can be used to selectively remove the sacrificial gate electrode layer. The sacrificial gate dielectric layer is thereafter removed using plasma dry etching and/or wet etching.

Then, the first semiconductor layers 25 are removed from the channel regions by using, for example, a wet etching operation. In some embodiments, the first semiconductor layers 25 can be selectively removed using a wet etchant such as, but not limited to ammonium hydroxide ($NH_4OH$), tetramethylammonium hydroxide (TMAH), ethylenediamine pyrocatechol (EDP), a potassium hydroxide (KOH) solution, a hydrochloric acid (HCl) solution, or a hot ammonia solution. A plasma dry etching or a chemical vapor etching may also be used.

After the nanowires of the second semiconductor layers 22 are released in the channel regions, metal gate structures are formed. The metal gate structures includes a high-k gate dielectric layer 82, one or more layers of work function adjustment material 84 and a body gate electrode layer 86 as set forth above, as shown in FIG. 34.

Figure 34:
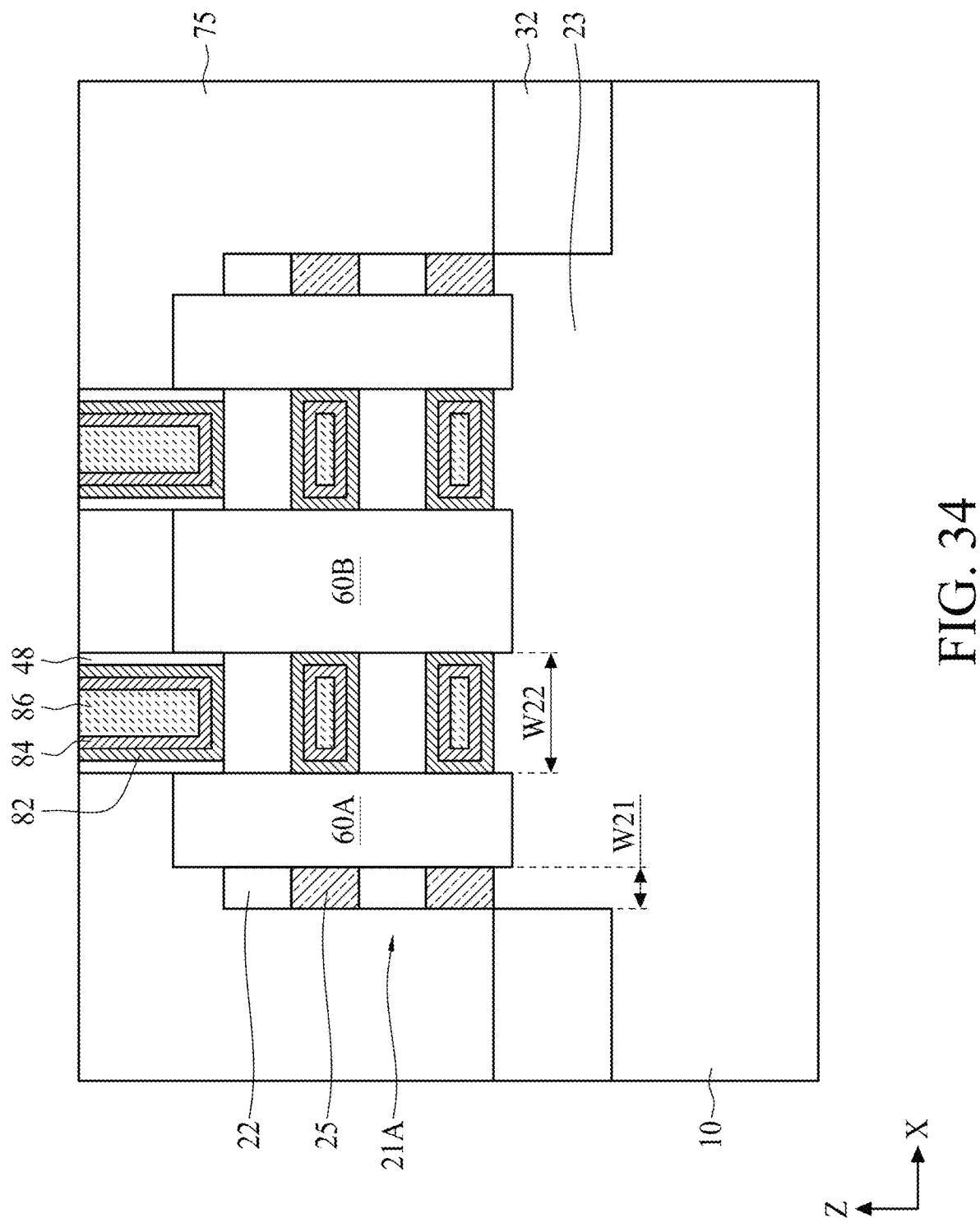
FIG. 34 illustrates a cross sectional view of one of the various stages of a semiconductor device fabrication process in accordance with another embodiment of the present disclosure.

As shown in FIG. 34, the fin structure includes an edge fin structure 21A disposed over a bottom fin structure 23. The edge fin structure 21A includes the first semiconductor layers 25 and the second semiconductor layers 22 alternately stacked. In some embodiments, the width W21 of the edge fin structure 21A is in a range from 5 nm to 30 nm. In some embodiments, the width W21 of the edge fin structure 20A is smaller than the width W22 of the channel semiconductor wire 22.

In the present embodiments, in the recess etching of the active region or the fin structure in a source/drain region, a cover layer is adjusted to keep a part of a crystalline semiconductor (e.g., Si) at the side face of the recess facing the isolation structure. Accordingly, an epitaxial layer can grow along the Si boundary and form a symmetric and uniform epitaxy profile. Further, since a larger epitaxial layer can be obtained, it is possible to achieve a higher driving current. In addition, it is possible to achieve a lower leakage current, and to improve DIBL property.

It will be understood that not all advantages have been necessarily discussed herein, no particular advantage is required for all embodiments or examples, and other embodiments or examples may offer different advantages.

In accordance with an aspect of the present disclosure, in a method for manufacturing a semiconductor device, an isolation structure is formed in a substrate defining an active region, a first gate structure is formed over the isolation structure and a second gate structure over the active region adjacent to the first gate structure, a cover layer is formed to cover the first gate structure and a part of the active region between the first gate structure and the second gate structure, the active region between the first gate structure and the second gate structure not covered by the cover layer is etched to form a recess, and an epitaxial semiconductor layer is formed in the recess. In one or more of the foregoing and following embodiments, the first gate structure and the second gate structure extend in a first direction and are arranged in a second direction crossing the first direction, and the epitaxial layer does not touch the isolation structure along the second direction. In one or more of the foregoing and following embodiments, the epitaxial layer does not touch the isolation structure. In one or more of the foregoing and following embodiments, each of the first gate structure and the second gate structure includes a poly silicon layer, a hard mask layer disposed over the poly silicon layer and sidewall spacers, and the cover layer is made of a different material than the hard mask layer and the sidewall spacers. In one or more of the foregoing and following embodiments, after the epitaxial semiconductor layer is formed, the cover layer is removed. In one or more of the foregoing and following embodiments, a distance from an edge of the isolation structure to an edge of the cover layer over the active region is in a range from 10 nm to 30 nm.

In accordance with another aspect of the present disclosure, in a method of manufacturing a semiconductor device, an isolation structure is formed in a substrate surrounding an active region, and a first gate structure is formed over the isolation structure and a second gate structure and a third gate structure are formed over the active region. The first, second and third gate structures extend in a first direction and are arranged in a second direction crossing the first direction. A cover layer is formed to cover edges of the active region extending in the first direction and to cover the isolation structure. The active region not covered by the cover layer is etched to form a first recess between the isolation structure and the second gate structure and a second recess between the second gate structure and the third gate structure, and a first epitaxial semiconductor layer is formed in the first recess and a second epitaxial semiconductor layer is formed in the second recess. In one or more of the foregoing and following embodiments, a volume of the first epitaxial layer is smaller than a volume of the second epitaxial layer. In one or more of the foregoing and following embodiments, a depth of the first recess is smaller than a depth of the second recess. In one or more of the foregoing and following embodiments, a maximum width along the second direction of the first recess is smaller than a maximum width along the second direction of the second recess. In one or more of the foregoing and following embodiments, the cover layer does not cover edges of the active region extending in the second direction. In one or more of the foregoing and following embodiments, the first epitaxial layer does not touch the isolation structure in the second direction. In one or more of the foregoing and following embodiments, the first epitaxial layer and the second epitaxial layer touch the isolation structure in the first direction. In one or more of the foregoing and following embodiments, the cover layer covers edges of the active region extending in the second direction. In one or more of the foregoing and following embodiments, the first epitaxial layer does not touch the isolation structure. In one or more of the foregoing and following embodiments, each of the first, second and third gate structures includes a poly silicon layer, a hard mask layer disposed over the poly silicon layer and sidewall spacers, and the cover layer is made of a different material than the hard mask layer and the sidewall spacers. In one or more of the foregoing and following embodiments, after the first and second epitaxial semiconductor layers are formed, the cover layer is removed.

In accordance with another aspect of the present disclosure, in a method of manufacturing a semiconductor device, a fin structure protruding from an isolation structure over a substrate is formed, a first gate structure is formed over the fin structure, a cover layer is formed to cover an edge portion of the fin structure and the isolation structure, the fin structure not covered by the first gate structure and the cover layer is etched to form a recess, and an epitaxial semiconductor layer is formed in the recess. In one or more of the foregoing and following embodiments, the first gate structure includes a poly silicon layer, a hard mask layer disposed over the poly silicon layer and sidewall spacers, and the cover layer is made of a different material than the hard mask layer and the sidewall spacers. In one or more of the foregoing and following embodiments, the fin structure includes first semiconductor layers and second semiconductor layers alternately stacked over a fin bottom structure. In one or more of the foregoing and following embodiments, the cover layer covers the edge portion with an amount of 15 nm to 25 nm from an edge of the fin structure.

In accordance with one aspect of the present disclosure, a semiconductor device includes an isolation structure formed in a substrate and surrounding an active region, a first gate structure and a second gate structure disposed over the active region and a dummy gate structure disposed over the isolation structure, and a first source/drain epitaxial layer disposed between the dummy gate structure and the first gate structure and a second source/drain epitaxial layer disposed between the first gate structure and the second gate structure. The first, second and dummy gate structures extend in a first direction and are arranged in a second direction crossing the first direction. A volume of the first epitaxial layer is smaller than a volume of the second epitaxial layer. In one or more of the foregoing and following embodiments, a depth of the first epitaxial layer is smaller than a depth of the second epitaxial layer. In one or more of the foregoing and following embodiments, a maximum width along the second direction of the first epitaxial layer is smaller than a maximum width along the second direction of the second epitaxial layer. In one or more of the foregoing and following embodiments, the first epitaxial layer does not touch the isolation structure in the second direction. In one or more of the foregoing and following embodiments, the first epitaxial layer and the second epitaxial layer touch the isolation structure in the first direction. In one or more of the foregoing and following embodiments, the first epitaxial layer does not touch the isolation structure. In one or more of the foregoing and following embodiments, the first epitaxial layer is separated from the isolation structure by a part of the substrate in the second direction, and a width of the part of the substrate in the second direction is in a range from 15 nm to 25 nm.

In accordance with another aspect of the present disclosure, a semiconductor device includes a fin structure protruding from an isolation structure formed over a substrate. The fin structure includes a first channel fin structure and a first edge fin structure disposed over a bottom fin structure. The semiconductor device further includes a first gate structure disposed over the first channel fin structure, and a first source/drain epitaxial layer disposed between the first gate structure and the first edge fin structure. In one or more of the foregoing and following embodiments, a width of the first edge fin structure is in a range from 5 nm to 30 nm. In one or more of the foregoing and following embodiments, a width of the first edge fin structure is smaller than a width of the first channel fin structure. In one or more of the foregoing and following embodiments, the fin structure further includes a second channel fin structure disposed over the fin bottom structure. The semiconductor device further includes a second gate structure disposed over the second channel fin structure, and a second source/drain epitaxial layer disposed between the first gate structure and the second gate structure. In one or more of the foregoing and following embodiments, a volume of the first source/drain epitaxial layer is smaller than a volume of the second source/drain epitaxial layer. In one or more of the foregoing and following embodiments, a depth of the first source/drain epitaxial layer is smaller than a depth of the second source/drain epitaxial layer. In one or more of the foregoing and following embodiments, a maximum width of the first source/drain epitaxial layer is smaller than a maximum width of the second source/drain epitaxial layer.

In accordance with another aspect of the present disclosure, a semiconductor device includes first semiconductor wires disposed over and vertically arranged over a substrate, a first gate structure wrapping around the first semiconductor wires, an edge fin structure disposed over the substrate, and a first source/drain epitaxial layer disposed between the first semiconductor wires and first gate structure, and the edge fin structure. In one or more of the foregoing and following embodiments, a width of the edge fin structure is in a range from 5 nm to 30 nm. In one or more of the foregoing and following embodiments, the semiconductor device further includes second semiconductor wires disposed over and vertically arranged over the substrate, a second gate structure wrapping around the second semiconductor wires, and a second source/drain epitaxial layer disposed between the first gate structure and the first semiconductor wires, and the second gate structure and the second semiconductor wires. In one or more of the foregoing and following embodiments, a volume of the first source/drain epitaxial layer is smaller than a volume of the second source/drain epitaxial layer. In one or more of the foregoing and following embodiments, a maximum width of the first source/drain epitaxial layer is smaller than a maximum width of the second source/drain epitaxial layer. In one or more of the foregoing and following embodiments, the edge fin structure includes first semiconductor layers and second semiconductor layers alternately stacked.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
an isolation structure formed in a substrate adjacent an active region;
a first gate structure and a second gate structure disposed over the active region;
a dummy structure disposed over the isolation structure,
wherein the first gate structure, second gate structure, and dummy gate structure extend in a first direction and are arranged in a second direction crossing the first direction;
a first source/drain epitaxial layer disposed between the dummy structure and the first gate structure and a second source/drain epitaxial layer disposed between the first gate structure and the second gate structure; and
an etch stop layer disposed over sidewalls of the dummy structure, first gate structure, and second gate structure,
wherein the etch stop layer has a step therein in between the dummy structure and the first gate structure; and
the second source/drain epitaxial layer extends a greater distance into the substrate than the first source/drain epitaxial layer.

2. The semiconductor device of claim 1, wherein a maximum width along the second direction of the first source/drain epitaxial layer is smaller than a maximum width along the second direction of the second source/drain epitaxial layer.

3. The semiconductor device of claim 1, wherein the first source/drain epitaxial layer does not touch the isolation structure in the second direction.

4. The semiconductor device of claim 1, wherein the first source/drain epitaxial layer and the second epitaxial layer touch the isolation structure in the first direction.

5. The semiconductor device of claim 1, wherein the first source/drain epitaxial layer does not touch the isolation structure.

6. The semiconductor device of claim 1, wherein:
the first source/drain epitaxial layer is separated from the isolation structure by a part of the substrate in the second direction.

7. The semiconductor device of claim 6, wherein a width of the part of the substrate in the second direction is in a range from 15 nm to 25 nm.

8. The semiconductor device of claim 1, wherein the first source/drain epitaxial layer includes one or more of SiP, SiCP and SiC layers.

9. A semiconductor device, comprising:
a fin structure protruding from an isolation structure formed over a substrate,
wherein the fin structure includes a first channel fin structure, and an edge fin structure disposed over a bottom fin structure;
a first gate structure disposed over the first channel fin structure;
a first source/drain epitaxial layer disposed in the fin structure between the first gate structure and the edge fin structure;
a second channel fin structure disposed over the bottom fin structure;
a second gate structure disposed over the second channel fin structure; and
a second source/drain epitaxial layer disposed in the fin structure between the first gate structure and the second gate structure,
wherein the second source/drain epitaxial layer extends into the fin structure a greater distance than the first source/drain epitaxial layer.

10. The semiconductor device of claim 9, wherein a width of the edge fin structure is in a range from 5 nm to 30 nm.

11. The semiconductor device of claim 9, wherein a width of the first edge fin structure is smaller than a width of the first channel fin structure.

12. The semiconductor device of claim 9, wherein a maximum width of the first source/drain epitaxial layer is smaller than a maximum width of the second source/drain epitaxial layer.

13. The semiconductor device of claim 9, wherein the first source/drain epitaxial layer includes one or more of SiP, SiCP and SiC layers.

14. The semiconductor device of claim 9, wherein the first source/drain epitaxial layer is SiP or SiCP, and the first source/drain epitaxial layer further includes As.

15. A semiconductor device, comprising:
a plurality of first semiconductor nanostructures disposed over a substrate,
wherein the plurality of first semiconductor nanostructures are arranged along a first direction perpendicular to a main surface of the substrate;
a first gate structure wrapping around the first semiconductor nanostructures;
a first edge fin structure disposed over the substrate including alternately stacked first semiconductor layers and second semiconductor layers;
a first source/drain epitaxial layer disposed between the first semiconductor nanostructures and the first gate structure, and the first edge fin structure;
a plurality of second semiconductor nanostructures arranged along the first direction over the main surface of the substrate;
a second gate structure wrapping around the second semiconductor nanostructures; and
a second source/drain epitaxial layer disposed between the first gate structure and the first semiconductor nanostructures, and the second gate structure and the second semiconductor nanostructures,
wherein the second source/drain epitaxial layer extends a greater distance into the substrate than the first source/drain epitaxial layer.

16. The semiconductor device of claim 15, wherein a width of the first edge fin structure is in a range from 5 nm to 30 nm.

17. The semiconductor device of claim 15, wherein the first edge fin structure includes first semiconductor layers and second semiconductor layers alternately stacked.

18. The semiconductor device of claim 15, wherein the first source/drain epitaxial layer is SiP or SiCP, and the first source/drain epitaxial layer further includes As.

19. The semiconductor device of claim 15, wherein the first source/drain epitaxial layer includes one or more of SiP, SiCP and SiC layers.

20. The semiconductor device of claim 15, wherein a maximum width of the second source/drain epitaxial layer is greater than a maximum width of the first source/drain epitaxial layer.

* * * * *